(12) United States Patent
Graner

(10) Patent No.: US 12,063,010 B2
(45) Date of Patent: Aug. 13, 2024

(54) MICRO ELECTRIC POWER STATION AND MICRO GRID

(71) Applicant: Peter Graner, Kfar Saba (IL)

(72) Inventor: Peter Graner, Kfar Saba (IL)

(*) Notice: Subject to any disclaimer, the term of this patent is extended or adjusted under 35 U.S.C. 154(b) by 277 days.

(21) Appl. No.: 17/424,325

(22) PCT Filed: May 30, 2019

(86) PCT No.: PCT/IL2019/050627
§ 371 (c)(1),
(2) Date: Jul. 20, 2021

(87) PCT Pub. No.: WO2020/148743
PCT Pub. Date: Jul. 23, 2020

(65) Prior Publication Data
US 2022/0069767 A1 Mar. 3, 2022

(30) Foreign Application Priority Data
Jan. 20, 2019 (IL) .......................................... 255843

(51) Int. Cl.
*H02S 40/44* (2014.01)
*H02J 7/35* (2006.01)
(Continued)

(52) U.S. Cl.
CPC ................ *H02S 40/44* (2014.12); *H02J 7/35* (2013.01); *H02S 20/32* (2014.12); *H02S 40/22* (2014.12); *H02S 40/38* (2014.12); *H02S 40/42* (2014.12)

(58) Field of Classification Search
CPC .......... H02S 40/44; H02S 40/22; H02S 40/38; H02S 40/42; H02S 20/32; H02J 7/35
See application file for complete search history.

(56) References Cited

U.S. PATENT DOCUMENTS

| 5,538,563 A | 7/1996 | Finkl |
| 5,646,397 A | 7/1997 | Wenham et al. |

(Continued)

FOREIGN PATENT DOCUMENTS

| DE | 102014213248 A1 | 1/2016 |
| EP | 3072202 A1 | 9/2016 |

(Continued)

OTHER PUBLICATIONS

European Patent Office, Supplementary European Search Report for European Application No. 19910097, dated Sep. 16, 2022, 7pp.
(Continued)

*Primary Examiner* — Jeffrey M Shin
(74) *Attorney, Agent, or Firm* — The Roy Gross Law Firm, LLC; Roy Gross

(57) ABSTRACT

A Multiple Bifacial Photovoltaic Transparent Panels Thermal Triangles Reflective Minors Ensemble system which is configured to be oriented towards the sun and relative to the horizon, the mirrors reflecting the sunray to the bifacial PV panels front, back and underside faces. There is a plurality of rhombus or trapeze shaped sunray path openings, mounted on a small footprint, above a two axes tracking mechanism. Further, an Micro-Electric Power Station MEPS capable of obtaining energy from a plurality of Rear/Back and side sun ray reflectors sources, located in between various bifacial photovoltaic transparent solar thermal panels. The reflector sources may include an integrated laminated mirror film around the inside of a casing/envelope of a rhombus thin (e.g. glass) box or of transparent sunrays magnifying concentrator envelope balloon. The MEPS facility may be mounted above streets and traffic junctions, on a structure which may be referred to as Micro-Grid Electric Pylons MGEP.

18 Claims, 16 Drawing Sheets

(51) Int. Cl.
  *H02S 20/32* (2014.01)
  *H02S 40/22* (2014.01)
  *H02S 40/38* (2014.01)
  *H02S 40/42* (2014.01)

(56) References Cited

U.S. PATENT DOCUMENTS

| | | |
|---|---|---|
| 8,872,379 B2 | 10/2014 | Ruiz et al. |
| 9,246,334 B2 | 1/2016 | Ansari et al. |
| 9,488,968 B2 | 11/2016 | Tilley et al. |
| 10,148,224 B2 | 12/2018 | Khudysh et al. |
| 2010/0089436 A1* | 4/2010 | Watters ............... H01L 31/0547 |
| | | 136/246 |
| 2010/0181957 A1 | 7/2010 | Goeltner |
| 2010/0212720 A1 | 8/2010 | Meyer et al. |
| 2011/0209743 A1 | 9/2011 | Clive |
| 2011/0272003 A1 | 11/2011 | Elazari |
| 2012/0259723 A1 | 10/2012 | Ansari et al. |
| 2017/0063295 A1 | 3/2017 | Panish |
| 2017/0230000 A1 | 8/2017 | Abdelghany Hassabou |
| 2017/0257059 A1 | 9/2017 | Kutzer et al. |
| 2017/0356676 A1 | 12/2017 | Rosa |

FOREIGN PATENT DOCUMENTS

| | | |
|---|---|---|
| IL | 200987 A | 8/2013 |
| IN | 2012CH04585 | 12/2012 |
| KR | 20140097057 A | 8/2014 |
| WO | 2008/114248 A1 | 9/2008 |

OTHER PUBLICATIONS

Israel Patent Office, Notification of Deficiencies for Israeli Patent Application No. 255843, dated Jan. 21, 2018, 3pp.

Intellectual Property India, Examination Report Under Sections 12 & 13 of the Patent Act for Indian Patent Application No. 202117034004, mailed May 12, 2022, 5pp.

PCT International Search Report for International Application No. PCT/IL2019/050627, mailed Oct. 3, 2019, 3pp.

PCT Written Opinion for International Application No. PCT/IL2019/050627, mailed Oct. 3, 2019, 6pp.

PCT International Preliminary Report on Patentability for International Application No. PCT/IL2019/050627, issued Jun. 16, 2021, 7pp.

* cited by examiner

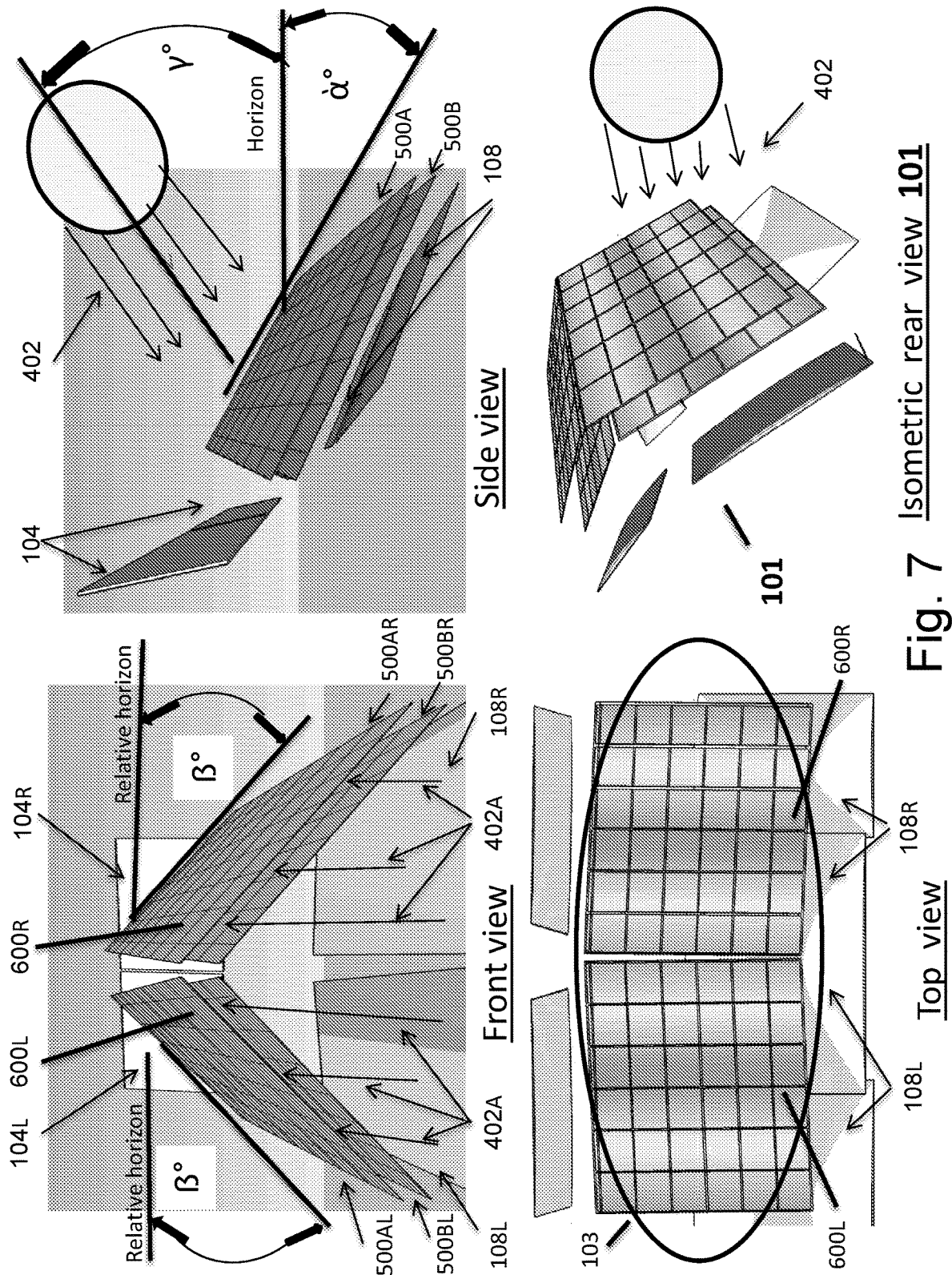
Fig. 7 Isometric rear view 101

MICRO ELECTRIC POWER STATION AND MICRO GRID

FIELD OF THE INVENTION

The present invention relates to the field of alternative energy for improving an urban environment and includes a geometrical structure with four-dimensional (4D), multiple triangles as rooftops shapes and which may be associated with Bifacial Photo-Voltaic Cells in the center of Transparent Panels (BPVTP). The Multiple BPVTP modules are characterized by multiple layers of bifacial (double sided) photo-voltaic cells. The Multiple BPVTP modules include bifacial photovoltaic panels with integrated layers of flat water, or liquid, transparent tanks surrounding the panel on the top and the bottom. The water or liquid tanks serve to absorb the heat from the Photo-Voltaic (PV) cells, increasing the output of electricity and producing a hot liquid. A relative shift exists between bifacial Photo-Voltaic (PV) panels which are placed one above the other the shift conforming to a gap in between PV cells. Accordingly, defined is a structure which may be viewed as a "4-faces Photo-Voltaic cells sandwiches form".

More particularly, a three-dimensional structure creates a novel "four-dimensional multiple arrays of bifacial photo-voltaic transparent panels Thermal combination", wherein each triangle as rooftops module, The modules are mounted on a tilted tower relative to the horizon and the sun, in various forms of array, and may be integrated with reflectors combined with light magnifying concentrators. The array may be oriented towards the sun in various positions, gathering energy from sunrays and from albedo associated with rear, bottom and side mirrors. The combination of the modules with the mirrors creates a Multiple Bifacial Photovoltaic Transparent Panels Thermal Triangles Reflective Mirrors Ensemble system which is configured to be oriented towards the sun and relative to the horizon, the mirrors reflecting the sunray to the bifacial PV panels front, back and underside faces. There is a plurality of rhombus or trapeze shaped sunray path openings, mounted on a small footprint, above a two axes tracking mechanism. More particularly, the invention relates to an Micro-Electric Power Station MEPS capable of obtaining energy from a plurality of Rear/Back and side sun ray reflectors sources, located in between various bifacial photovoltaic transparent solar thermal panels. The reflector sources may include an integrated laminated mirror film around the inside of a casing/envelope of a rhombus thin (e.g. glass) box or of transparent sunrays magnifying concentrator envelope balloon. The system may include electric batteries mounted/installed on the tracking unit to balance the weight of the multiple bifacial photovoltaic panels reflective mirrors pattern-modules frames and which additionally serve as a backup for power supply at peak electric consumption hours or for night consumption. The MEPS facility may be mounted above streets and traffic junctions, on a structure which may be referred to as Micro-Grid Electric Pylons MGEP. It may supply electricity without cessation, direct current (DC) or AC electrical power, to a plurality of electricity consumers (DC) or to AC electric power systems, including a plurality of Electric Vehicles (EV), buildings, apartments and domestic appliances, etc.

BACKGROUND OF THE INVENTION

In the near future Electric Vehicles (EV) may become the main means of transportation. These types of vehicles generally use an electric battery, e.g. Electric Cars (EC), Electric Motorcycles (EM) and Electric Bicycles (EB). Additionally, the use of photovoltaic panels in urban areas is expanding and is being used to generate hot liquid energy.

Several systems have been proposed, aimed to supply electricity and hot liquid, for charging electric vehicle's battery, and for other consumer purposes. These types of MEPS are generally capable of supplying a large amount of high DC electrical power, i.e. high Voltage, high direct current (DC), (e.g. from 3 kilowatt per hour (kWh) and higher, generally occupying a ground area in FIX installation with spaces for shadow between the panels of 18 m$^2$).

Presently the electricity is typically supplied with low efficiency from long distance AC supply electrical networks, supplied from distant power plants. The electricity is down-converted along the way, using high voltage to low voltage transformers, and flows through several relay and transformers stations, potentially generating harmful electromagnetic radiation into the environment. The power plants generally use electricity from, fuels, oil, coal, gas and carbon, among others. Moreover, supply of hot water from solar panels collector and which alternatively combine a hot water solar collector with a photovoltaic panel generate electricity and hot water at low efficiency and higher costs.

Several systems such as solar carport and some tower-based parking facilities use solar energy for charging EVs. These systems generally fail to provide sufficient amounts of electricity with a high efficiency and with a high energy level necessary for charging EV batteries and for other urban electric uses. Moreover HCPVT, CPV & PVP, such as for example those disclosed in U.S. Pat. No. 8,872,379 B2, CN102738864A, DE102014213248A1, EP2509181B1, U.S. Pat. No. 9,246,334B2, U.S. Pat. No. 9,488,968B2, US20100181957A1, EP3072202A1, U.S. 60/907,007, IL200987 have another major drawback as they lack the ability to supply generate high electric power and hot water within a relatively small area, thereby they are unable to be used as a core power source for the implementation of an MEPS. Moreover, few typical novel MEPS are capable of being installed above buildings, on the ground, on ships, and other various locations.

Multiple EV charging stations for charging batteries of plug-in EVs generally have a relatively high utilization demand of electrical energy. Full-electric EVs have batteries with a capacity of up to ~100 kWh and more (as of the date of filing of the present patent application). This describes a strong and available source of energy for everyday electricity consumers. For sake of comparison, a typical apartment consumes an average of ~2-3 kWh (day use) considering both AC and DC electrical power. It would be immensely advantageous to have a system capable of utilizing the electric power stored/accumulated/exchanged on batteries, combined with the Multiple Bifacial Photovoltaic Transparent Panels Thermal Triangles Reflective Mirrors Ensemble system, which may be operated to supply electric power to consumers in the immediate vicinity and to clusters of EVs, EMs, EBs. It could supply power to DC or AC electrical power consuming devices, domestic appliances, apartments, buildings, etc.

It is therefore another object of the present invention to provide a local electrical power station, capable of continuously providing high DC solar/PV-based, electrical power to EV batteries and to other local DC electricity and hot water consumers in an urban or other domestic environment, such as e-Bus stations, single buildings, or plurality of buildings, and apartment's domestic appliances, among others.

Today, many domestic appliances and other consumers in the apartment, buildings and etc., convert AC voltage power to low DC voltage. It is yet another object of the present invention, to provide a new local DC voltage electric MEPS that will enable users to easily switch from AC voltage to DC voltage while eliminating the need to convert AC to DC, so that all appliances, consumers and users will change the electric motors, heating elements, air conditioning compressors and other equipment, to consume electricity from the new DC voltage. The DC electricity could be locally distributed using the MGEP.

It is yet another object of the present invention to use DC Voltage Micro-Grid Electric Pylons, as a substitute for long distance AC cables and transformers on electricity pylons of the existing electricity grid.

Other objects and advantages of this invention will become apparent as the description proceeds.

SUMMARY OF THE INVENTION

The present invention relates to an Micro-Electric/Grid Power Station (e.g. off nationwide grid) for producing and supplying electricity and hot water from a plurality of novel multiple bifacial 4-faces and more Photo-Voltaic (PV) cells transparent panels having integrated water or liquid flat transparent tanks and pipes suitable to absorb heat and solar energy. The energy sources are combined together and concentrate high Direct Current (DC) voltage through one or more of four sides of bifacial (e.g.; upside down) photovoltaic cells Panel of transparent panels, relatively shifted one under the other. The bifacial PV cells transparent panels are separated from each other by a separation distance (e.g. integrated with glass or polycarbonate sheet or thin frameless). Alternatively, tempered anti reflect glass sheets may be used, forming 4-faces exposure to light as "multiple sandwiches". The panels may be integrated with rear/side/bottom mirror reflectors. Alternatively, thin-film bifacial PV cells may be used. The panels may be oriented such that they ae tilted towards the sun and the horizon, and may be arranged in triangulates modules creating a pyramid module four-dimensional ensemble in which may be arranged in different array combinations. Sunlight may be reflected towards the back through diamond-shaped path openings (e.g. beehive rhombus) to mirrors. The triangulates modules may be arranged on a structure in multiple zigzag tilted rows creating a Four-Dimensional (4D) Bifacial Photo-Voltaic Transparent Panels Thermal (4DBPVTPT) which is mounted on a tower structure. Each Micro-Electric Power Station MEPS is adapted to supply high DC voltage in a continuous manner, even during a breakdown or during the nighttime. Each Micro-Electric Power Station MEPS may enable charging/discharging (at least partly)/exchanging a plurality of DC and/or AC consumers/accumulators. A charged DC consumers/accumulators can be used as an energy source for charging other DC consumers/accumulators.

According to an embodiment of the invention, MEPS with Multiple Bifacial Photovoltaic Transparent Panels Thermal Triangles Reflective Mirrors Ensemble may include:

a). a plurality of four sides bifacial (e.g. upside down) PV Cells Panel sheets/layers relatively shifted one under the other of a Bifacial PV cells Panel (BPVP) with a separation between top and bottom transparent panels. Gap in-between the photovoltaic cells allow the transition to sun rays to layers as "4-faces" when the sun passes through the gap between the photovoltaic cells to the back of the other panel, creating sunray movements vibration between both back sides of the bifacial panels photovoltaic cells, increasing the electricity energy generation. At least two bifacial photovoltaic transparent panels are configured in couples and include respectively reflective mirrors. The triangles multiple bifacial photovoltaic transparent panel ensembles are connected serially side by side creating a row in zig zag shape. The rows are arranged in an upright terrace configuration of two or more tilted rows of Multiple Bifacial Photovoltaic Transparent Panels Triangles Reflective Mirrors Ensemble. The rows may be mounted on a diamond shape frame structure, laminated inside with mirror films, which is combined and integrated above a motorized, two-channel sun tracking/heliostat mechanism unit.

b) Mechanical couplers connecting each pair of panels to another pair in one row respectively, and to the row above, and respectively, to reflective mirrors with the proper angles secured with mechanical fittings/couplers. Alternatively, there is no need for an aluminum frame and MEPS is adapted to continuously concentrate and distribute DC electric power to one or more consumers.

According to an embodiment of the invention, the energy sources are from solar MEPS facility which produce DC electrical power and which are installed on buildings and other facilities located in the area of the MEPS. Optionally, the MEPS may be installed on roofs and on the exterior of commercial and/or residential buildings. Optionally, the MEPS may be combined among nature with artificial or natural greenery, thereby enabling to increase the DC power supply capabilities of the MEPS micro electric power station.

According to an embodiment of the invention, the MEPS facility further includes various magnifiers which may concentrate sunrays on the Bifacial Photo-Voltaic Cells Transparent Panels (CBPVCTP) layers units, increasing the power capacity in each CBPVCTP. In the CBPVCTP may be installed and attached bidirectional hot water, or liquid, transparent tank layers and pipes system (e.g. used as a substitute for hot water pipes collector) for integrated hot water and electricity production from the same module, enabling cooling and supplying of hot water for domestic or commercial usages. The water layers are heated from the CBPVCTP cells unit and sunray energy.

According to an embodiment of the invention, the MEPS facility may take advantage of existing electricity ultra-high voltage electricity pylons onto which may be installed the heliostat mechanism (sun tracker) integrated with Multiple Bifacial Photovoltaic Transparent Panels Thermal Triangles Reflective Mirrors Ensemble. Those local (nearby) pylons and ultra-high voltage cables may connect/supply electric power to/for robotic parking facilities which may provide electrical charging/discharging (at least partly)/exchanging to "fuel" electric stations and other electric consumers.

According to an embodiment of the invention, the MEPS further includes a management software tool for managing the entire facilities and DC power consumption, services and applications usages that are provided via the electric power station.

BRIEF DESCRIPTION OF THE DRAWINGS

In the drawings:

FIG. 7 schematically illustrates single multiple bifacial photovoltaic transparent panels reflective mirrors pattern-modules, integrated with bottom, rear and side mirror reflectors, which provide crossing reflective sunlight at the outer edges of the Multiple Bifacial Photovoltaic Transparent Panels Triangles Ensemble which is shown tilted towards the sun & horizon and includes triangular rooftops module array, according to another embodiment of the invention;

DETAILED DESCRIPTION OF THE INVENTION

Figure 1:
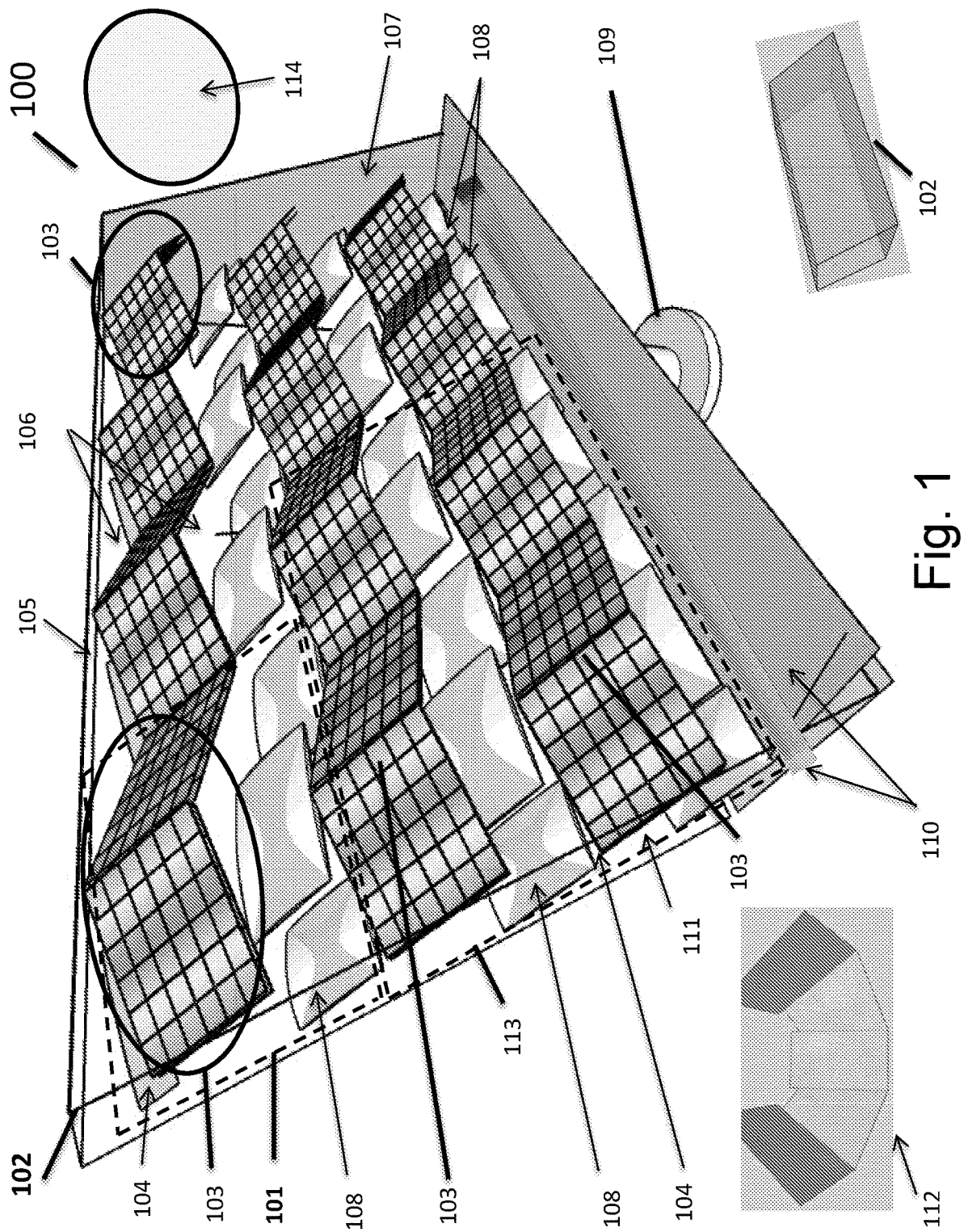
FIG. 1 schematically illustrates an upright tilted tower of Four-Dimensional Bifacial Photo-Voltaic Transparent Panels Thermal with Reflect Mirrors (4DBPVTPTRM) with bottom and surrounding reflective mirrors, arranged in a zigzag shape and geometrically constructed in 4-dimensions, and with a 3-dimensional integrated above heliostat mechanism create the Micro-Electric Power Station MEPS facility which is configured for continuously charging/discharging (partly)/exchanging/accumulating direct current (DC) using balancing weight batteries, and further configured to produce and supply hot water and electricity, according to an embodiment of the present invention.

The present invention describes a Micro Electrical Power Station (MEPS) defined by a geometrical structure which includes a plurality of multiple bifacial (double sided) photovoltaic cells transparent panels with Bifacial Photovoltaic Cells and with integrated water or liquid flat transparent tanks and pipes which serve to absorb heat and solar energy. The MEPS is adapted to produce electrical DC power and hot water. The MEPS may include use of a Concentrator of sunray which directs the sun rays to the Photovoltaic Cells (CPVC collectively solar panels) etc.

The following approach describes a new innovative hybrid module technology for bifacial photovoltaic cells transparent panel (double sided) with gaps (e.g. spaces) shifted between the panels, which allows sunlight & albedo penetration from a plurality of absorption from different directions. The approach further defines a new type of at least "4-faces sandwich" of four glass layers-modules.

The following approach describes a novel technology for glass-modules using tempered thin anti reflect glass.

By means of thin tempered glass, the new approach is ideal for at least two bifacial photovoltaic panels and allows free selection of mirrors laminating foils for the peripheral structure.

Use of thin glass or a transparent envelope with positive air inside the balloon structure provides better sunlight transmission-absorption which is proportional to the thickness of the glass or the balloon envelope easy cleaning.

Using anti reflects tempered glass or combined with standard thin glass keeps the cells in a neutral phase during assembly and shaping of the modules and the structure frame. Alternatively, instead of using thin glass, a thin flexible transparent material may be used as a basis for the multiple bifacial photovoltaic layers associate transparent panels. The bifacial photovoltaic cells transparent panels may be placed one on top of the other, relatively shifted with respect to each other and with a separation distance between them, and may be tilted (back to back PV sheets). The panels may be assembled into multiple triangle modules which may be placed adjacent to each other creating an array of multiple panels arranged in zig zag shapes, and which may be further arranged in overlapping terraced tilted rows or in a circular or partially circular arrangement.

The thin top and bottom back sheets provide optimum light transmission resulting up in up to 6% and more energy yield. The absorption is proportional to the glass or any other transparent material thickness. Due to thin transparent material the whole diamond frame structure is speeded up. Additionally, temperature discharge from the cells benefits from the thin material too which provide a light-weight advantage compared to conventional ones.

Any type of reflective foils can be used and there are no high requirements for the foils. Furthermore, this method does not require any aluminum frames and can be assembled easily. The frameless method (does not require any aluminum beams structure) and its lightweight multi bifacial modules, open up new possibilities for Multiple Bifacial Photovoltaic Transparent Panels Thermal Triangles Reflective Mirrors Ensemble applications.

Applying this method, it is possible to integrate Multiple Bifacial Photovoltaic Transparent Panels Triangles Reflective Mirrors Ensemble to increase the electrical energy production potential in a small footprint area and installed above a tracking mechanism. For example, a 3-tilted floors/rows array of Multiple Bifacial Photovoltaic Transparent Panels Triangles Reflective Mirrors Ensemble installed in a configuration of of overall size of 6,000 mm×5,000 mm×variable four dimensions results in a 30 m² footprint. The electrical energy output may be estimated to be: 2800 Pcs of multiple layers of bifacial half, quarters or smaller photo voltaic cells×3 Wat/cell=9,000 Wp×90% efficiency (due to the tilt angle towards the sun which is assumed to be ~20°-25°)=8,000 W. A total area of bifacial photovoltaic transparent panels of 4-faces/layers exposed to sunlight is 48 m² Aluminum fasteners (mechanical glass connectors), may connect between Multiple Bifacial Photovoltaic Transparent Panels Triangles Reflective Mirrors Ensemble, configured of Four-Dimensional (4D) combination of various bifacial photo voltaic panels reflect mirrors thermal (4DBPVT-PRMT) ensemble. Alternatively, associated with concentrated photovoltaic systems, the MEPS may be integrated with a variety of sun ray focused concentrators/magnifier at tilted angles, allowing stronger light power, without the need for cooling systems.

This approach for highly efficient, Multiple Bifacial Photovoltaic layers Transparent Panel Reflective Mirrors Pattern-Modules, solves multiple problems observed with conventional single layers of bifacial photovoltaic-module encapsulation methods and is a significant step forward to energy savings and local parity. Furthermore, the new multiple frame/frameless, Multiple Bifacial Photovoltaic layers Transparent Panels Thermal Triangles Reflective Mirrors Ensemble provide for low-cost applications in green buildings, EV charger ports, and sun-blinds among others. Use of an anti-reflect front envelope to the sun for the entire Multiple Bifacial Photovoltaic layers Transparent Panels Thermal Triangles Reflective Mirrors Ensemble eliminates the need for anti-reflect individual use of each subassembly panel, thereby creating a situation in which increasing the power generation of each panel is significantly improved. This new approach provides better light transmission plus unreached flexibility and durability of Multiple Bifacial Photovoltaic layers Transparent Panels Triangles Reflective Mirrors Ensembles facility.

In addition, electrical power is obtained/received from one or more batteries for one or more Electric Vehicles (EVs). Several Multiple Bifacial Photovoltaic Transparent Panels Triangles Reflective Mirrors Ensemble systems mounted on a building roof, gathering energy and split to different channels are capable of providing electrical DC power to several power consumers, such as batteries of EVs, Residential, commercial buildings, instruments and domestic appliances which consume and will use DC electricity (e.g. domestic or public LED light fixtures, computers, battery chargers, and oven, air conditions, refrigerator etc.). The DC electricity may be supplied via DC electricity local grid (MGEP) and DC electrical outlet, as is known in the art.

The MEPS of the present invention is aimed at replacing the traditional electricity network and its power sources (i.e. electric power plants). Moreover, as the growing interest in EVs results in an ever increasing market share (growing from 0.01% in 2010, to 0.25% in 2013 and 0.86% in 2016 and assumedly in 2025-30 exchanged most to EV), charging and discharging ports will in the future replace refueling stations.

The MEPS comprises modular batteries system which may be connected to the local power grid MGEP coming into a building, charging facility and as will be described in further details.

DETAIL DESCRIPTION OF THE DRAWINGS

Reference is now made to FIG. 1 which schematically illustrates a Micro-Electric Power Station MEPS 100 including an upright tilted tower with Four-Dimensional combination of various Bifacial Photovoltaics layers of Transparent double glass Panels Thermal integrated Reflective Mirrors (4DBPVTPTRM) facility exposed to the sun 114, according to an embodiment of the present invention. As Micro-Electric Power Station MEPS 100 is for continuously supplying DC electricity or AC electricity and includes a batteries array (e.g., as indicated by numeral 401 in FIG. 4) used to provide the structure with a balance weight and as electric energy accumulator. MEPS facility 100 may include a plurality of Multiple Bifacial Photovoltaic Transparent Panels Triangles Reflective Mirrors Ensemble systems 101, as indicated by the area within the boundaries of the dotted line numeral 101 in FIG. 1. The MEPS facility 100 is capable of charging and/or discharging the batteries array (e.g., as indicated by numeral 401 in FIG. 4), and simultaneously charge EVs batteries (as long as an EV remains electrically connected to the charging and/or discharging MEPS). Furthermore, each of the Multiple Bifacial Photovoltaic Transparent Panels Triangles Reflective Mirrors Ensemble 101 may be spaced to optimize collection of sun energy and to accommodate various Multiple Bifacial Photovoltaic Transparent Panels Triangles Sub-assembly 103. MEPS facility 100 may include a frame (e.g. glass) with reflector mirrors and which may include a diamond/trapezoidal open/closed box shape. The frame 102 (or casing structure) may be laminated with mirror foils or with a flexible transparent sun ray magnifying concentrator envelop with positive air inside the balloon 102. It may include a base/floor (e.g. glass) mirror 110 which may be connected to edge (faces) side mirrors 107 and 111 and back side mirrors 106 (e.g. glass, foil), all of which may be facing in the direction of the sun's rays. Additionally included may be a plurality of angled and/or arched and/or parabolic and/or paraboloid mirrors 104, 108. On the top and front of the diamond/trapeze box frame 102 may be used a transparent tempered (e.g. glass) or alternatively concentrated magnifier foil 105. According to some embodiments, in addition to their charging/discharging capabilities, MEPS 100 can also be used as a central, multiple, common share storage/accumulate batteries energy unit (eliminating the need for, individual private batteries backup).

Figure 13:
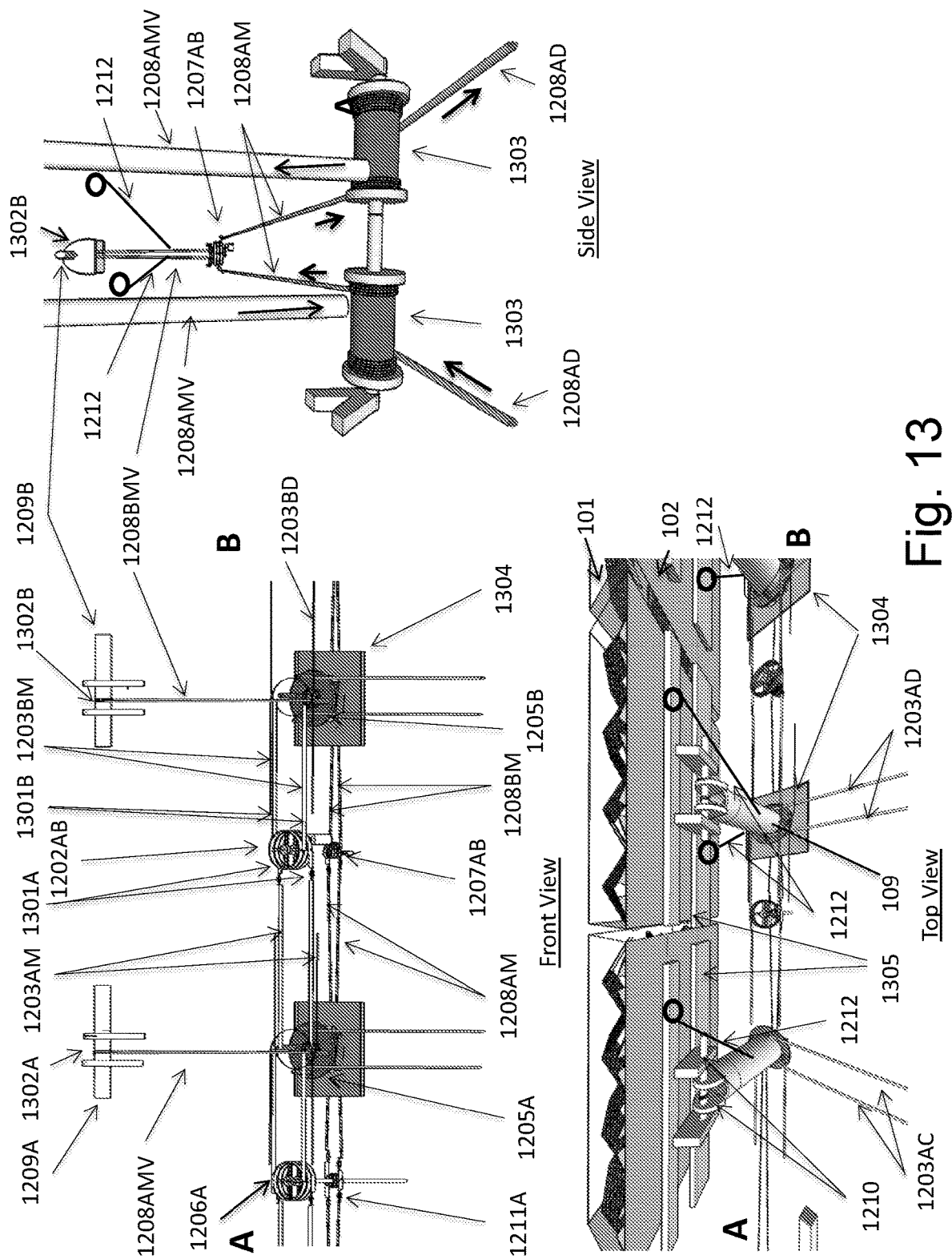
FIG. 13 schematically illustrates a MEPS integrated with a variety of groups of common wheels, associated with electric gears motors, which are drive various cables or chain links, in various surfaces and different layers, and combined into an array of various multiple axis sun-tracking mechanisms, according to an embodiment of the invention.

In this embodiment, each Multiple Bifacial Photovoltaic Transparent Panels Triangles Reflective Mirrors Ensemble 101 is erected and connected using mechanical glasses or various material foil couplers (connectors) in between Multiple Bifacial Photovoltaic Transparent Panels Triangles Sub-assembly 103 and mirrors reflectors 104 and 108 (e.g., through brackets located along the side or top of each Multiple Bifacial Photovoltaic Transparent Panels Triangles Sub-assembly 103. On the edge or on the middle of each module 600 (see FIG. 6), with column support is connected to multi couplers arms) in order to maintain the penetration of the sun effectively using the structural base 904 (shown in FIG. 9), or alternatively, using flexible cables (wires) couplers. In this embodiment, between tilted rows (levels), vertices of assembly of Multiple Bifacial Photovoltaic Transparent Panels Triangles Reflective Mirrors Ensemble 101, may be mounted respectively in one line above the other in a diamond-shaped configuration. Tracking/Heliostat mechanism 109 (e.g., more particularly as shown in FIG. 13) is capable of rotating both clockwise and counterclockwise, while simultaneously moving up and down. Multiple Bifacial Photovoltaic Transparent Panels Triangles Reflective Mirrors Ensemble 101 can be attached to the diamond-shaped or trapezoid-shaped box frame 102 of the main structure of MEPS 100.

In this embodiment, three floors of terraces of Multiple Bifacial Photovoltaic Transparent Panels Triangles Reflective Mirrors Ensemble 101 are mounted on the structure of the box frame 102. MEPS 100 is configured to concentrate and distribute electrical power throughout MEGP.

In the lower left corner of FIG. 1 is shown a general view of a casing comprising a multi-mirrors structure which include diamond trapezoidal shape 112. The casing with the mirrors structure 112 direct the sunray energy with albedo radiation reflections.

Figure 7A:
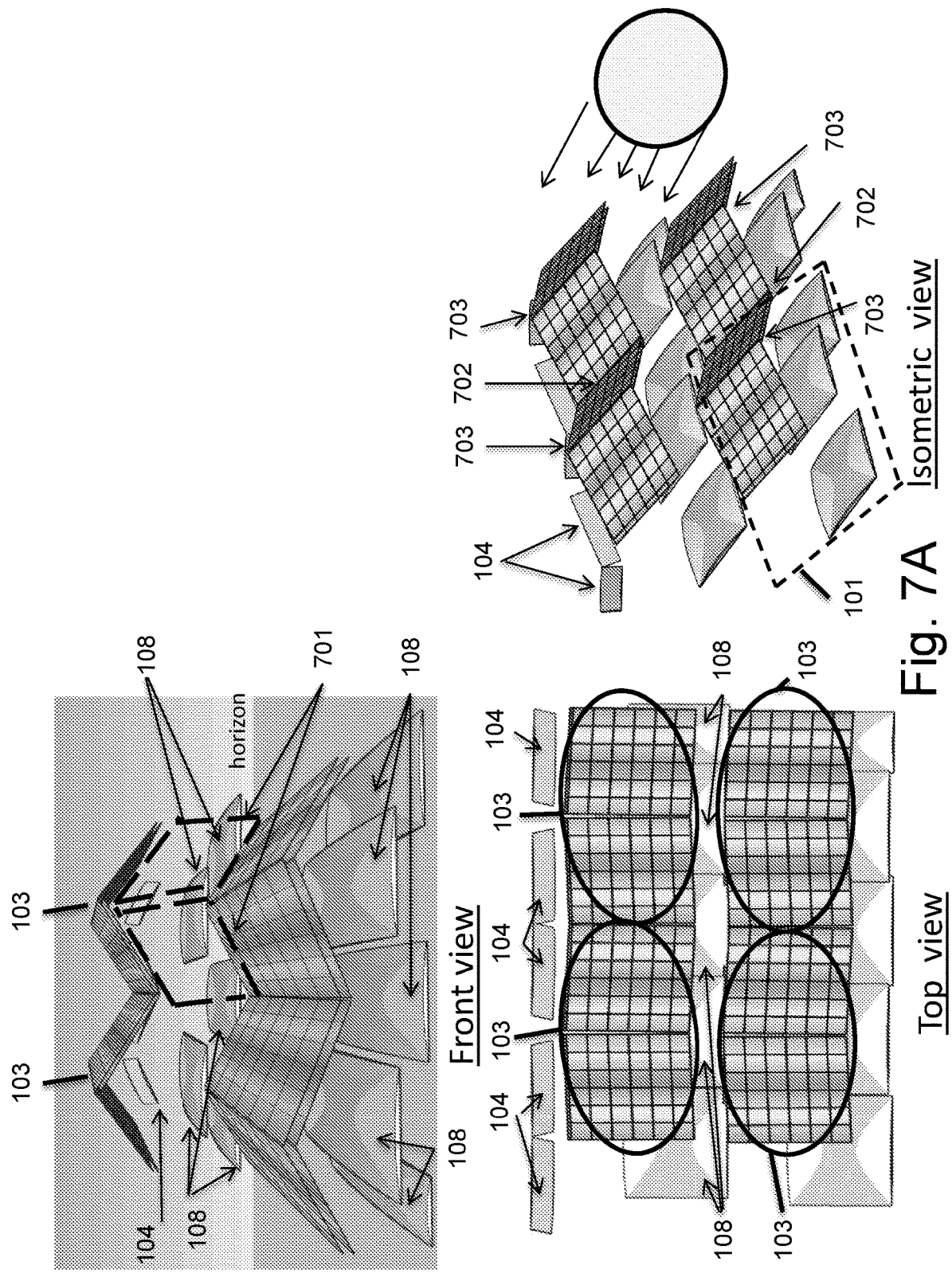
FIG. 7A schematically illustrates for example at least four Multiple Bifacial Photovoltaic Transparent Panels Triangles Reflective Mirrors Ensemble structures in two rows (two floors), with vertices placed one above the other in one line, with the crossing reflective sunlight at the outer edges of the Multiple Bifacial Photovoltaic Transparent Panels Triangles Ensemble, and with diamond/rhombus-shaped openings and surrounding mirrors, according to another embodiment of the invention.

Additionally, at least four Multiple Bifacial Photovoltaic Transparent Panels Triangles Reflective Mirrors Ensemble 101 are arranged with their vertices placed on the structure one above the other in one line, as shown by dotted line 113 (e.g., more details as shown in FIG. 7A)

In a charging mode, Multiple Bifacial Photovoltaic Transparent Panels Triangles Reflective Mirrors Ensemble 101, transfers the total high voltage DC received from BPVP to the batteries array 401. In discharging mode, batteries array 401 splits and transfers high voltage DC from the charged batteries array to various consumers. This novel and unique structure enables continuous distribution of bidirectional electricity from local MEPS through an MEGP in order to charge/discharge electricity to other DC or AC consumers without cession.

The uprightness of Micro-Electric Power Station MEPS facility 100 provides several advantages over ordinary PVP/CPV array facility, as it enables a continuous electric supply. MEPS facility 100 includes data communication means to enable communication with, and to remotely control the operation of, the MEPS facility 100, e.g., via a router (Wi-Fi or any other wireless or bi-directional data communications means).

Figure 2:
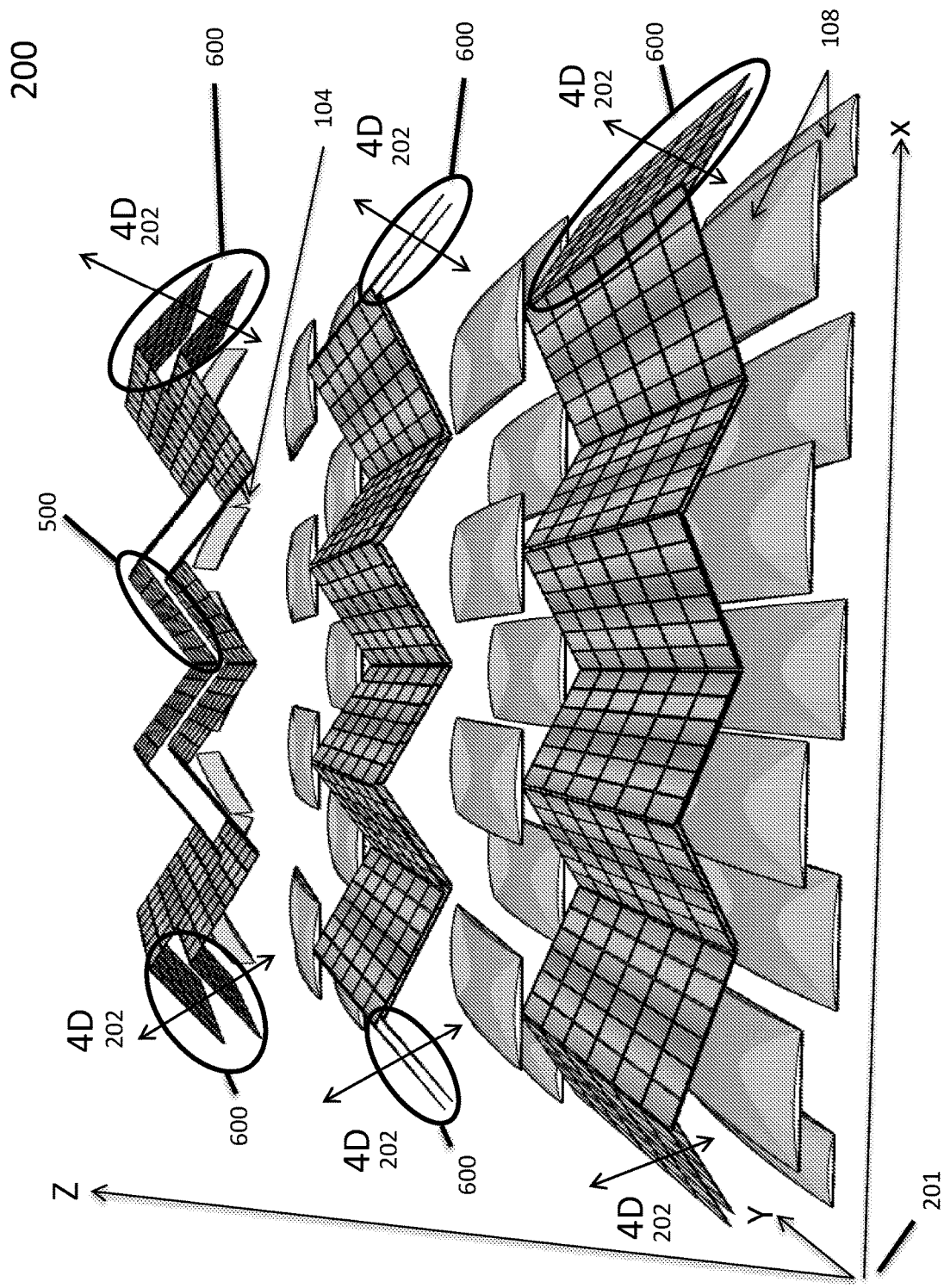
FIG. 2 schematically illustrates a perspective front view of a typical double sided Bifacial (e.g.; upside down) PV multiple sheets/layers of Four-Dimensional Bifacial Photovoltaic layers of Transparent Panels Thermal integrated Reflective Mirrors, integrated with rear side and bottom Mirrors Reflectors, or alternatively, with thin-film multiple Bifacial PV cells tilt oriented towards the sun and relative to the horizon and to the triangles modules array, and reflecting to the back with diamond-shaped openings, the integration of all the elements together forming the structure of the fourth dimension (4D), and further integrated with above motorized two channel tracking/heliostat mechanism having a small footprint, according to an embodiment of the invention.
Figure 5:
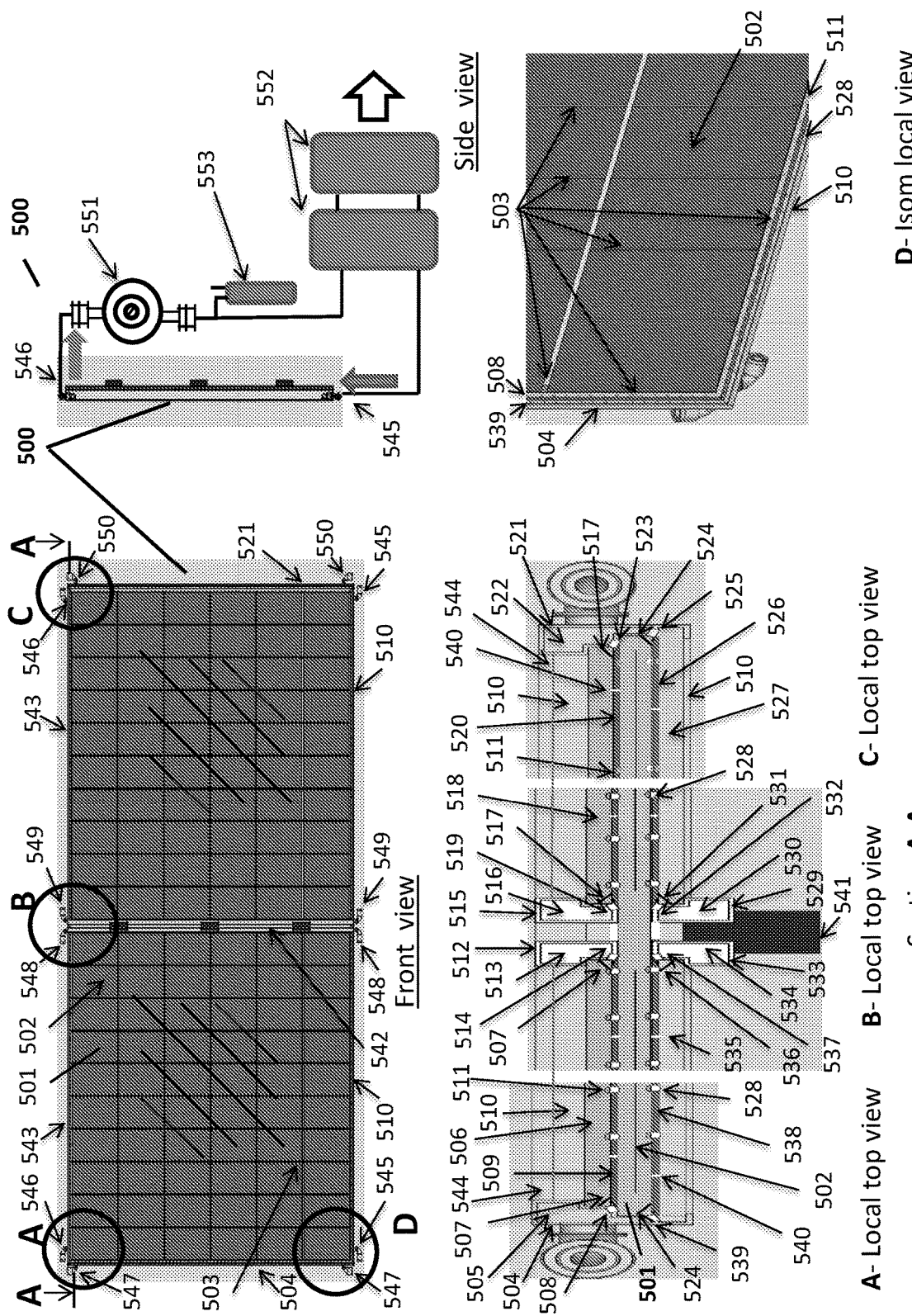
FIG. 5 schematically illustrates parallel and perspective views of the Bifacial Photo-Voltaic Transparent Panel Thermal including Bifacial half, quarters or smaller Photo-Voltaic cells in the center between double glass of Transparent Panel with middle electrical junction boxes, integrated with Thermal bidirectional hot water pipes/conduits coupled to flat water/liquid tanks layers with anti-reflect or regular glasses (or any transparent material) layers, according to an embodiment of the invention.
Figure 6:
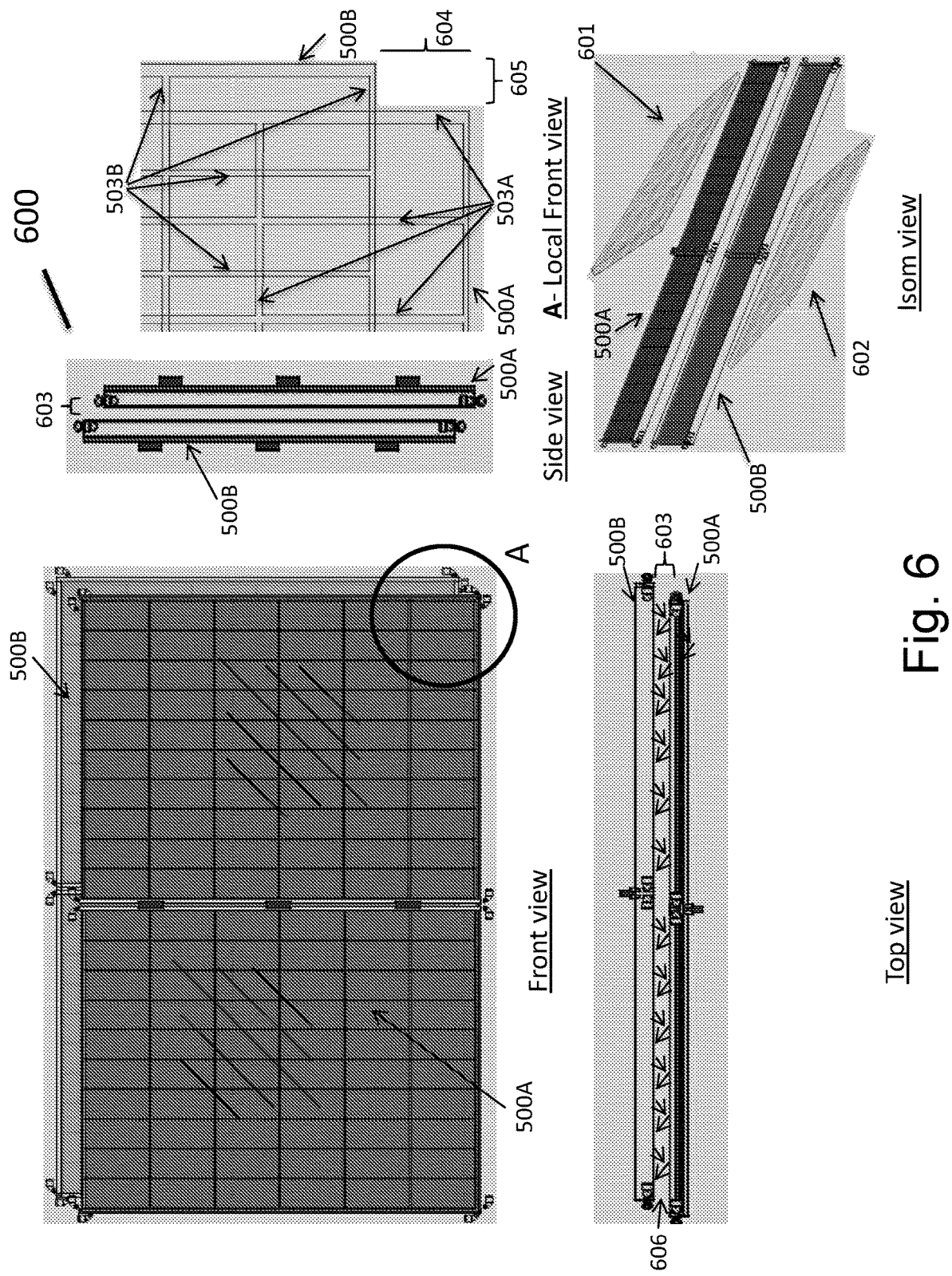
FIG. 6 schematically illustrates at least four sides upside down of bifacial photovoltaic cells sheets/layers back to back, arranged in a layers array of at least "4-faces sandwiches" module in a tilt mode, making up the structure of fourth-dimension (4D), and integrated with magnifier or/and concentrators, according to an embodiment.

Reference is now made to FIG. 2 which schematically illustrates a front view of multiple layers of Four-Dimensional (4D) Bifacial Photovoltaic layers of Transparent Panels Thermal integrated Reflective Mirrors, including Multiple Bifacial Photovoltaic Transparent Panels Triangles Reflective Mirrors Ensemble 101 and sufficient space for accommodating the Ensemble, according to an embodiment of the present invention. The Multiple Bifacial Photovoltaic Transparent Panels Triangles Reflective Mirrors Ensemble 101 are shown configured one above the other in one vertex line, (as per the example shown in FIG. 1 with direct or crossing tilted angled mirrors reflectors 104 in the back side and on the bottom another array of direct or crossing angled mirrors reflectors 108, reflecting the sun's rays to multi bifacial photovoltaic transparent panel module 600. Multi bifacial photovoltaic transparent panel module 600 comprises four sides upside down or at least two Bifacial Photo-Voltaic cells sheets/layers of; transparent single BPV 500 (e.g., as shown in FIG. 5), relatively shifted one underneath the other of a bifacial photovoltaic cells transparent panels, with a separation gap in between them (e.g., as shown in FIG. 6). The Multiple Bifacial Photovoltaic Transparent Panels Triangles Sub-assembly 103 (e.g., as shown in FIG. 1) are configured in a zigzag shape, and are geometrically constructed in 4 dimensions, which include 3 dimensions which are length, width and height, marked with number 201, and the fourth dimension which is associated with the adjustable separation gap between 2-photovoltaic panels module 600 and is marked with an arrow in the direction of the fourth dimension respectively (4D) 202, which is relative to the 3-dimensions 201.

Multiple Bifacial Photovoltaic Transparent Panels Triangles Reflective Mirrors Ensemble 101 are connected through High voltage DC electric & data cables deployed through a main central tracking shaft conduit fittings. High Voltage DC & data signals may be connected to an electrically insulated cables guide track rail to the main Micro-Electric power station smart Energy Management Center.

Figure 3:
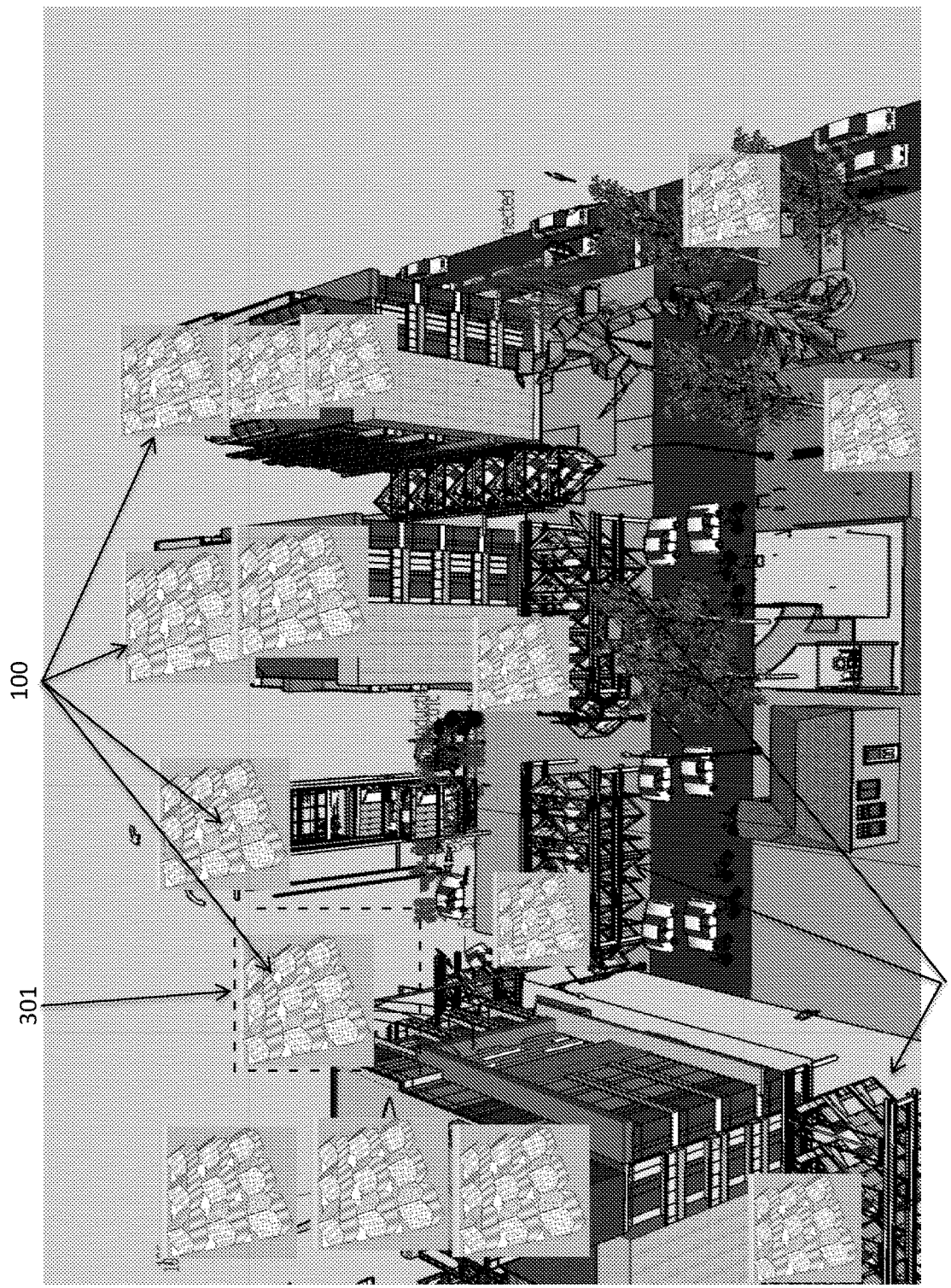
FIG. 3 schematically illustrates an urban environment including buildings, streets, junctions, and trees that are integrated with various MEPS energy source facilities, (e.g., residential buildings, light pylons, on exist grid pylons), according to an embodiment of the invention.

Reference is now made to FIG. 3 which schematically illustrate exemplary scenarios of MEPS facility 100 supplying electricity when situated throughout public spaces, and e.g., on flexible or rigid pylons attached to natural and artificial trees. The MEPS facility 100 may provide electricity to near street side parking spaces and street lights and other consumers.

It is noted that the invention is not limited to a specific location and numbers of plurality of Multiple Bifacial Photovoltaic Transparent Panels Triangles Reflective Mirrors Ensemble 101 (see FIG. 10) shown in MEPS facility 100 (see FIG. 1), and they can be placed on any structure capable of carrying the weight of the solar BPVTPT panels.

One exemplary implementation of MEPS 100 (see FIG. 1), may include integrating it above and/or situated in the proximity of various horizontal robotic parking charging/discharging/exchange/accumulate facilities 302, residential buildings, existing lights pylons, and on other existing grid pylons.

According to an embodiment of the invention, MEPS facility 100 can be combined with synthetic or natural plants, trees and other greenery (collectively greenery) in order to keep an aesthetic environment (e.g., as indicated by the area within the boundaries of the dotted line 301 in FIG. 3, which both show a robotic parking facility combined with synthetic or natural plants).

MEPS facility may be used with an energy management center for apartments; buildings that include multiple charging, discharging and accumulating of EVs, EMs, EBs; multiple CPVT, CPV, PV; multiple vertical and horizontal parking/cabins installed with communications system via router (Wi-Fi or any other wireless or bi-directional data communications) In an optional arrangement, MEPS 100 may be used for suppling hot water to various consumers with meters management systems. The integration of all of the assemblies together, as described above, combined with pylons and electricity transmission cables create the local electricity grid MGEP for DC electricity power production and transmission, and to simultaneously supply hot liquid.

Figure 4:
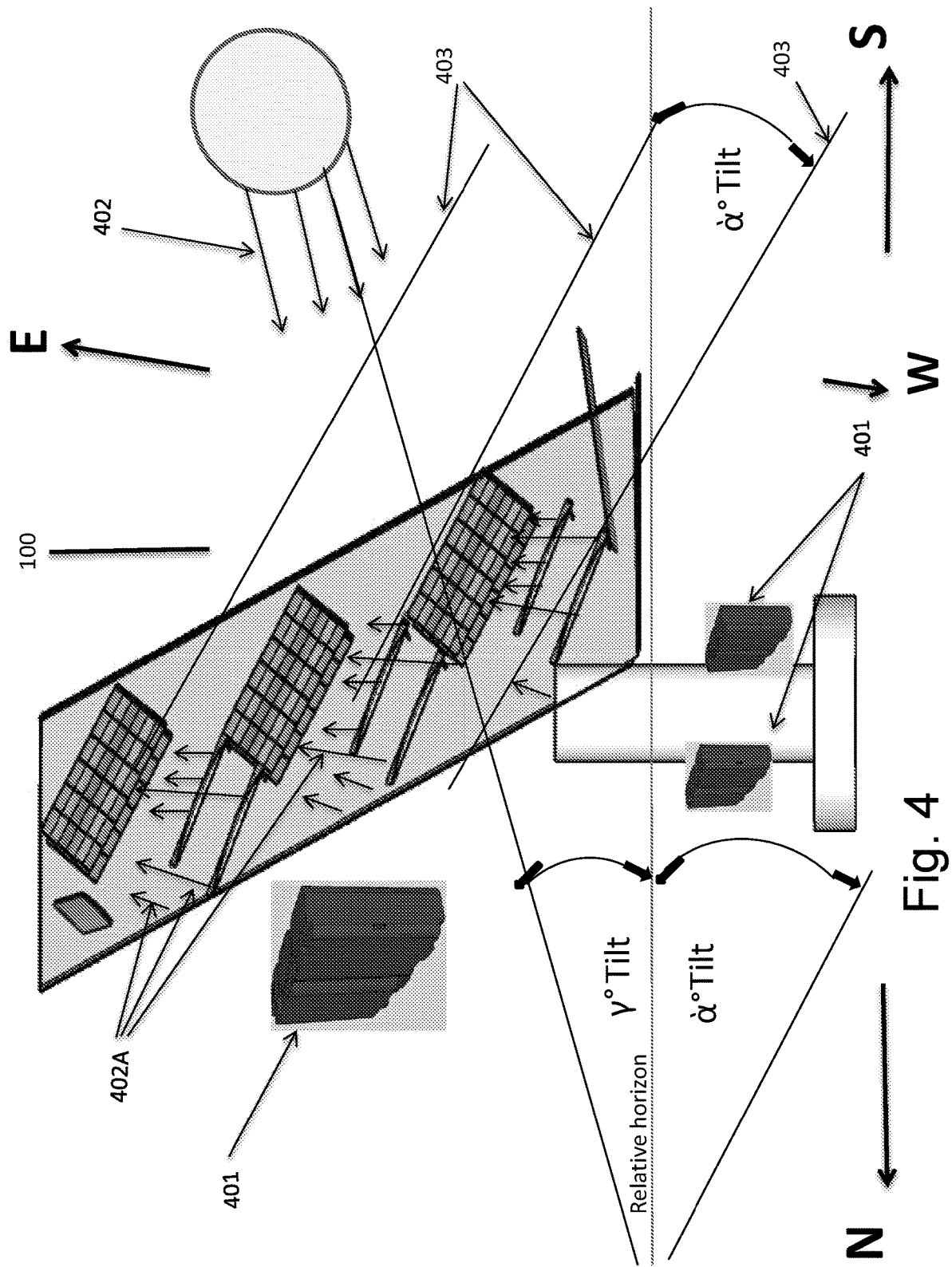
FIG. 4 schematically illustrates a perspective views of a plurality of Multiple Bifacial Photovoltaic Transparent Panels Triangles Reflective Mirrors Ensemble tilted at an angle (e.g. ~25-30° side views) relative to the sunrays, and have two functions; the balance weight and batteries, according to an embodiment of the invention.

Reference is now made to FIG. 4 which schematically illustrate perspective side views of Micro-Electric Power Station (MEPS) 100 unit relative to the direction of the South, according to an embodiment of the present invention. MEPS 100 includes the balance weight batteries 401, and is shown, e.g. with the sun's rays 402 at $\gamma°$ (e.g. ~30°) degrees relative to the horizon (e.g. or ~60° to the zenith), and the top face of the Micro-Electric Power Station 100 in the direction of the sun (marked as 3-guide lines 403), respectively with contrary angle tilt of $\alpha°$ (e.g. ~~30°) degrees or more relatively to the ground/horizon. This tilt may provide for a transition path for reflecting sunrays 402A through the narrow gaps in between the cells. Additionally, the Micro-Electric Power Station 100 system follows the sun with a heliostat mechanism to the North-South-East-West respectively.

Reference is now made to FIG. 5 which schematically illustrates parallel and perspective views of single Bifacial Photo-Voltaic cells in the center of Transparent double glass Panel including electrical junction boxes in the middle and integrated with Thermal top and bottom hot water pipes/conduits coupled (connected) to flat water/liquid transparent tanks layers to form single hybrid Bifacial Photo-Voltaic cells Transparent double glass Panel Thermal 500, according to an embodiment of the present invention.

Front view: Shown in this view are Bifacial (two sides) half, quarters or smaller of Photo-Voltaic Cells 502 in-between two glasses layers, known as Bifacial Photo-Voltaic Transparent Panel 501, where between Photo-Voltaic Cells 502 there are transparent gaps (spaces) 503, designated for sunray transition to the bottom back side of second Bifacial Photo-Voltaic Transparent Panel 500B (e.g., as shown in FIG. 6). In the middle are connected electrical junction boxes with outlet cables 541. Additionally shown are, on both sides of Bifacial Photo-Voltaic Transparent Panel 501, adjacent water/liquid circulation in-between glass layers flat tanks (e.g. along the BPVP ~1 m"m gap thickness), connected through multiple incline holes in one or two rows 511 and 528 punched in hollow rod/profiles, or in pipes 510. To it are connected chilled water/liquid inlets 545. On the other side are connected multiple incline holes in one or two row 511 and 528 punched in profiles or in pipes 543. To it are connected hot water/liquid outlets 546. Divider bars 542 in the middle of the Bifacial Photo-Voltaic Transparent Layers 501 form at least two Thermal tanks layers 509 and 538 (in small size of Bifacial Photo-Voltaic Transparent Panel 500). In case of a bigger size, the divider bars may be used to form four water transparent tanks with additional liquid tanks 520 and 526. The water tanks serve to absorb heating from the Bifacial Photo-Voltaic Transparent Panel 501.

Top view section A-A emplacement in portrait installation: In operation, chilled water/liquid passes through inlet connectors 547 connected to punched hollow rods/profiles or pipes 504, passes through center 505 and from there through multiple incline holes in one or two rows, bottom row 508 and top row 539. To absorb the heating, the first bottom flat water/liquid tank 509 and first top water/liquid tank 538 are situated between Bifacial Photo-Voltaic Transparent Panel 501 and the tempered anti reflect glass bottom 506 and glass top 535 (including integrated transparent support points 540). Two side incline edges cut at the ends 507, 524 and 536 to create wider water passage. Heated liquid comes out through multiple incline holes in bottom row 514 and top row 537 through middle punched hollow rods/profiles or bottom pipe 512 and top pipe 533. The liquid then passes through the center bottom 513 and center top 534 and pumped out from the connectors 548 and transferred to the liquid heat exchanger tanks 552. The same procedure is done on the second upper part when chilled water/liquid passes through inlet connectors 549 connected to bottom punched hollow rods/profiles or pipes 515 and top 529, and then passes through bottom center 516 and top 530. From there it passes through multiple incline holes in one or two rows, bottom row 519 and top row 532. To absorb the heating, the second bottom flat water/liquid tank 520 and second top flat water/liquid tanks 526 are situated between Bifacial Photo-Voltaic Transparent Panel 501 and the tempered anti reflect glass bottom 518 and glass/transparent material top 527 (including integrated transparent support points 540). Two side incline edges cut at the ends 517, 524 and 531, create wider water passage. Heated liquid comes out through multiple incline holes in bottom row 523 and top row 525 through upper part punched hollow rods/profiles or bottom pipe 521. The liquid then passes through the center bottom 522 and pumped out from the connectors 550 to the liquid circulation pumping mechanism system 551 and transferred to the liquid heat exchanger tanks 552. In case of installation as an alternative to covering roof and roof tiles, all liquid connections will be installed inside the bifacial photo voltaic transparent panel thermal.

Side view: Shown in this view is where hot liquid, pumped out from top of the Bifacial Photo-Voltaic Transparent Panel 500 through connectors 546 and is circulated through the liquid circulation pump 551 (keep the flat liquid tanks 509, 520, 526 538 in suction position) located near to the liquid outlets 546 and transfer to the liquid heat exchange or regular tanks 552 in closed loop with a backup tank to complete fluid evaporation 553. Alternatively, when no hot liquids are consumed, the fluid circulation pumping continues to work at night to cool liquids in the fluid tanks 552 for reuse and later for cooling the bifacial photovoltaic panels during the following day. As the number of exit incline holes is greater than the number of incline holes in the intake, in order to prevent a condition of high fluid pressure entering the liquids flat tanks, particularly in case of over-pumping or blocking of fluid passages. a number of transparent support/hold points 540 are constructed on all glasses to prevent glass from touching each other during liquid flow.

Isometric local view D: Shown in this view, as described above, in between Photo-Voltaic cells 502 are transparent gaps (spaces) 503 suitable to allow sun ray passing through the gap to the bottom back side of second Bifacial Photo-Voltaic Transparent Panel 500B (e.g., as shown in FIG. 6). Also shown is a front corner view showing the location of the liquid passages through multiple incline holes 511, 528 punched in hollow rods/profile 510 in landscape installation and 508, 539 punched in hollow rods/profiles or pipes 504 in portrait installation.

To increase the thermal insulation, from the environment, integrated second layer may be additional flexible transparent or glass/transparent material alternatively reflecting mirrors 544 and used for thermal buffer layers, creating a space between the outer glasses of liquid tanks 506, 518, 535, 527 and a cold or hot environment.

Reference is made to FIG. 6 which schematically illustrates multiple layers of at least two Bifacial Photo Voltaic Transparent Panels 500A on top to the sun ray and underneath another Bifacial Photo Voltaic Transparent Panels 500B upside down facing to the reflecting mirrors, the panels shifted relative to one another in two different axis 604 and 605, according to an embodiment of the present invention. The panels 500A and 500B may be integrated with one another (e.g., as shown in FIG. 5), when the sun's rays pass through the gap between the photovoltaic cell to the back of the other panel, creating sunray energy vibration movements between both back sides of the panels of its photovoltaic cells, which are assembled in a novel concept of at least two Bifacial Photo Voltaic Transparent Panels Thermal Module 600, comprising at least four faces (4-sides exposed to light) and optionally more, of photovoltaic cells panels in a three-dimensional structure. Transparent gaps between photovoltaic cells 503A on the top allow the passage of the sun's rays to the underneath bottom (e.g. glass) Bifacial Photo Voltaic Transparent Panels 500B, The photovoltaic module 600 enables optimal exposure to the sun's rays when the top and back bottom faces are exposed directly to the sun's rays, or through magnifiers concentrators layers 601 and 602. A separation gap 603 (space) between the top and bottom panels allows for light (mirrors or albedo reflecting light) penetration correspondingly. The transparent gaps between the cells 503A and 503B (e.g., as shown in FIG. 5) also allow the passage of reflected sun's rays from reflective mirrors 104 and 108 (e.g., as shown in FIG. 7), to the opposite side of the Bifacial Photo-Voltaic Transparent Panel, simultaneously through the liquid transparent flats tanks, thereby, increase the power output. The output power may be further increased by incorporating two or more layers of sun's ray magnifying concentrators on each side of the bifacial photovoltaic cells as concentrator layer 601 exposed to the sun's rays on the top and second concentrator 602 on the sides & bottoms of Bifacial Photo Voltaic Transparent Panels 500B, alternatively, of regular glasses (without anti-reflect coating) the sun's rays continue to vibrate, illustrated with arrow lines 606 between the photovoltaic cells backs sides of bifacial panels, of the 500A and 500B panels, or alternatively, on a thin flexible-film bifacial photovoltaic cells erected/patterned, when the in tilt mode, and configured the structure of fourth-dimension (4D).

Reference is made to FIG. 7 which schematically illustrates a typical single Multiple Bifacial Photovoltaic Transparent Panels Triangles Reflective Mirrors Ensemble 101, integrated with bottom and rear mirrors reflectors 104R and 104L (e.g., as shown in FIG. 2), according to an embodiment of the present invention.

front view shows an arrangement resembling a triangular rooftop, opening relatively, to the opposite light reflectors of typical Multiple Bifacial Photovoltaic Transparent Panels Triangles Sub-assembly 103, and two contrary (opposite) sides of at least two bifacial photovoltaic transparent panel module 600 L and 600R, slopingly open with both sides at an angle β° tilted relative to horizon. Panel module 600L may include at least 4 bifacial photovoltaic cells faces, wherein the first top bifacial photovoltaic cells panel 500AL is connected with the second bottom bifacial photovoltaic cells panel 500BL and include a separation gap between them for sunlight or albedo penetration respectively, and a slight tilt angle between them, thereby allowing the transparent gaps between the cells to pass reflecting sun rays 402A (e.g., as shown in FIG. 4). Panel module 600R includes a third top bifacial photovoltaic cells layer 500AR connected with fourth bottom bifacial photovoltaic cells layer 500BR (alternatively un-tempered or without anti-reflect coating glass), and include a separation gap between them for sunlight or albedo penetration respectively, and a slight angle between them, thereby allowing the transparent gaps between the cells, to pass reflective sun rays 402A. Bifacial photovoltaic cells transparent panel 600L is attached and tilted to the opposite side of the first top edge vertex corner of bifacial photovoltaic transparent panel 600R creating a configuration resembling a triangular rooftop shape bifacial two side panels structure, respectively situated between relative horizon and the ground.

side view shows the single Multiple Bifacial Photovoltaic Transparent Panels Triangles Reflective Mirrors Ensemble 101, situated at a tilted angle α° relative to the horizon and at a contrary angle tilted relatively to the ground and oriented to the sun's rays tilt angle γ° relative to the horizon. Angle α° and contrary angle γ° (e.g. together creates ~60°), respectively, facing the sun's ray to project onto the top of Multiple Bifacial Photovoltaic Transparent Panels Triangles Sub-assembly 103 and simultaneously at reflectors 104 in the upper back and downwards towards the bottom of Multiple Bifacial Photovoltaic Transparent Panels Triangles Sub-assembly 103, and to the bottom reflectors mirrors 108 situated partly below and partly in front of Multiple Bifacial Photovoltaic Transparent Panels Triangles Sub-assembly 103. When placed at the tilted angle to the sun and the horizon, and the subassemblies 103 are placed adjacent to each other, the sun's rays may reach to the back and bottom mirrors through rhombus shaped openings, (see FIG. 7B).

FIG. 7A schematically illustrates an exemplary implementation structure associated with at least four Multiple Bifacial Photovoltaic Transparent Panels Triangles Reflective Mirrors Ensemble 101 (marked around with a dotted line) such that the vertices are one above the other, situated in one line (e.g., dotted line 113 as shown in FIG. 1), according to an embodiment of the present invention.

Front view shows the integration into the structure of the Rear Mirrors Reflector 104 (e.g., as shown in FIG. 2,) and the associated bottom reflective mirrors 108 situated below the Multiple Bifacial Photovoltaic Transparent Panels Triangles Sub-assembly 103. Two Multiple Bifacial Photovoltaic Transparent Panels Triangles Sub-assembly 103 one above the other as shown in two rows, to create opening to the sun's rays in a transition path of rhombus various shapes 701. This particular illustration of four Multiple Bifacial Photovoltaic Transparent Panels Triangles Sub-assembly 103 arranged in triangular rooftop shape, of two side by side panels having a "zig zag shape" structure, situated respectively between relative horizon and the ground, for example, defining a structure incorporating at least 8 multiple bifacial photovoltaic transparent panels module 600 (as shown in FIG. 6). Dotted rhombus shows the opening transition path for the sun's rays 701, through the opening between Multiple Bifacial Photovoltaic Transparent Panels Triangles Sub-assembly 103 to the back.

Top view shows the bottom reflectors mirrors 108 positioned and attracted to the back, below the Multiple Bifacial Photovoltaic Transparent Panels Triangles Sub-assembly 103, serving as a light magnifier combined with back rear mirrors 104.

Isometric view shows the exemplary at least eight, two bifacial photovoltaic transparent panels (e.g. 32-faces exposed to various lights sources), with vertex edges 703 of Multiple Bifacial Photovoltaic Transparent Panels Triangles Sub-assembly 103 in one line with second floor vertex edge 703,—the bottom edges 702 of Multiple Bifacial Photovoltaic Transparent Panels Triangles Sub-assembly 103 in one line with second floor bottoms edges 702 and connected side by side in a first floor row. Above the first row, installed is a second flow row arranged relative to the first floor row with line vertex 703 and the bottoms 702 respectively aligned. The ensemble 103 (in the first row and/or second row) may be arranged at a tilted angle and oriented to the sun's rays and relative to horizon, furthermore, with the additional contrary angle tilted relatively to the ground. Between the two or more tilted rows an opening may be formed which may include a rhombus or trapeze shape for free transition path to sunrays.

Figure 7B:
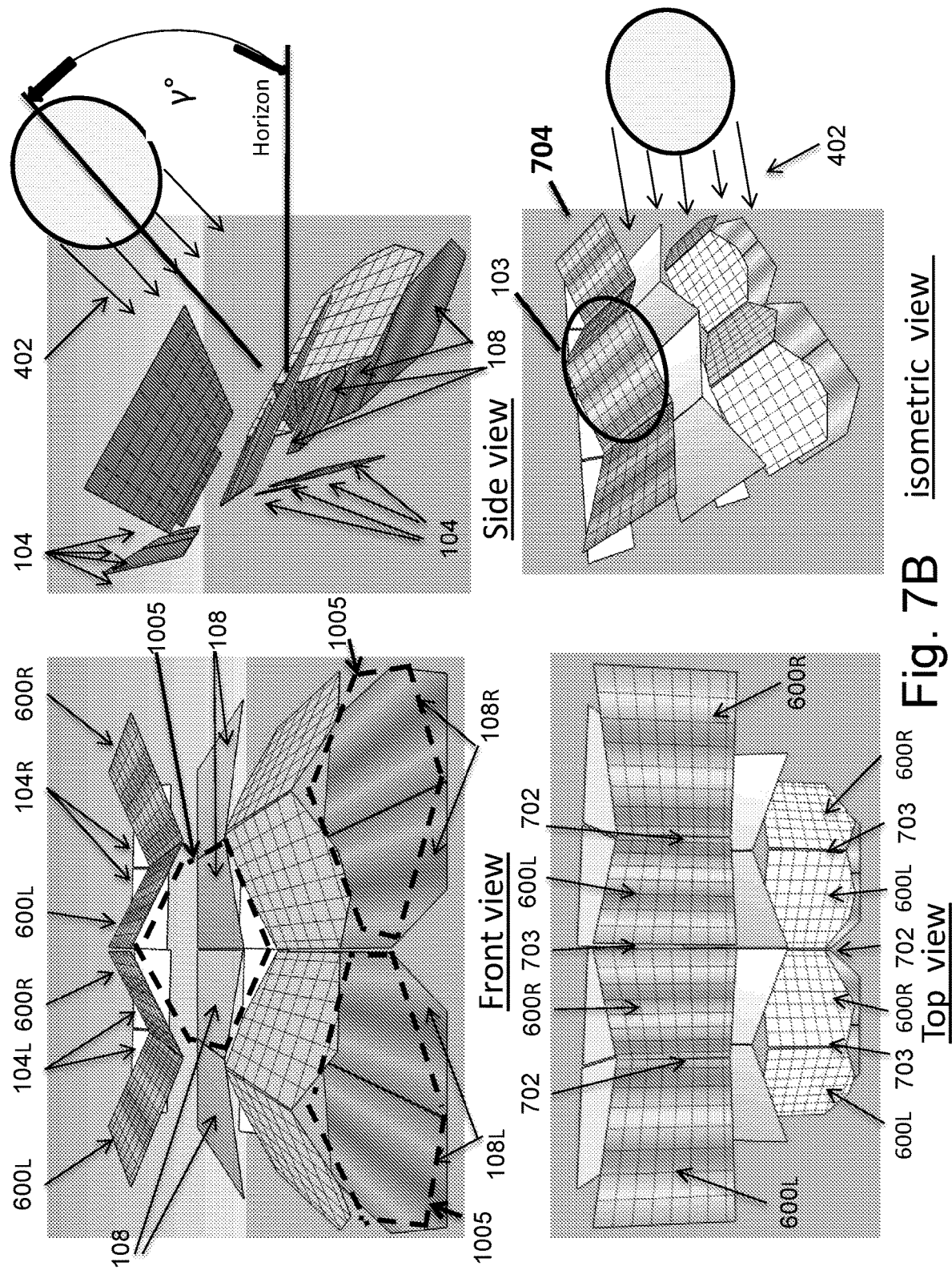
FIG. 7B schematically illustrates at least four Multiple Bifacial Photovoltaic Transparent Panels Triangles Reflective Mirrors Ensemble e.g. in two tilted rows (two floors), in the second upper (above) row, the cycle begins one side-shifted step aside and forward, according to another embodiment of the invention.
Figure 10:
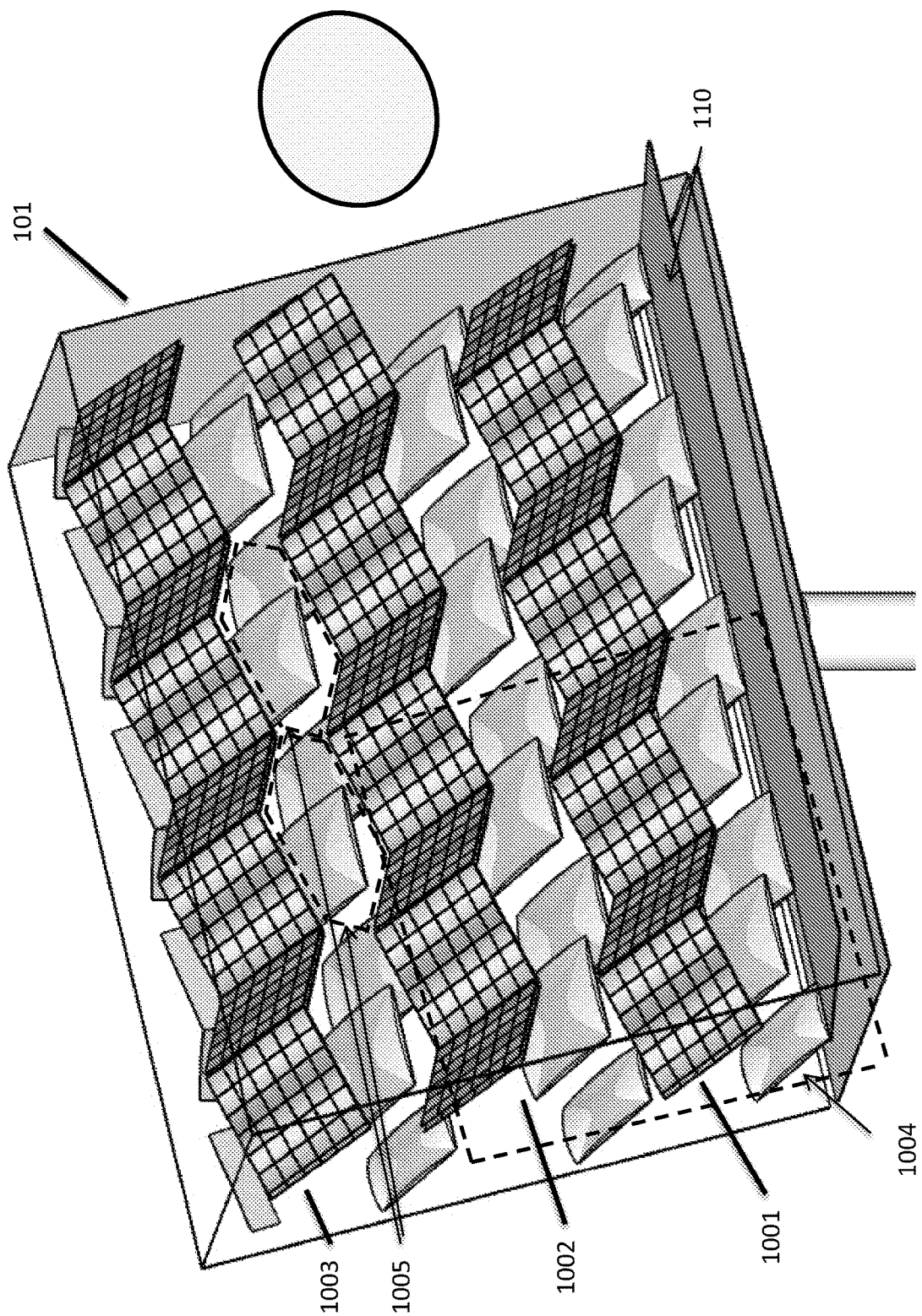
FIG. 10 schematically illustrates an exemplary implementation of three rows shifted aside and forward between the rows of Multiple Bifacial Photovoltaic Transparent Panels Triangles Reflective Mirrors Ensemble rows erected on the tilted tower and integrated with multiple reflective mirrors, according to an embodiment of the invention.

Reference is made to FIG. 7B which schematically illustrates a combination of at least four Multiple Bifacial Photovoltaic Transparent Panels Triangles Reflective Mirrors Ensemble 101, for example; in two rows (two floors) e.g., as indicated by the area within the boundaries of the highlighted dotted line 1004 in FIG. 10, according to an embodiment of the present invention. Each row includes at least eight Bifacial Photo-Voltaic cells Transparent Panel 500 associated within at least four bifacial photovoltaic transparent panels modules 600 L and 600R, together in the two rows at least sixteen Bifacial Photo-Voltaic cells Transparent Panel 500 of at least two bifacial photovoltaic transparent panel module 600 L and 600R with thirty two faces in square or rectangular or trapezes or any other shape combination. In the first bottom row, the top edge part of bifacial photovoltaic transparent panel 600L is connected and tilted to the opposite side of the top edge part of second bifacial photovoltaic transparent panels 600R, respectively, forming the first Multiple Bifacial Photovoltaic Transparent Panels Triangles Ensemble 103. The bottom edge part of second bifacial photovoltaic transparent panel 600R is connected and tilted to the opposite side of the bottom edge part of third bifacial photovoltaic transparent panel 600L respectively. From there, the top edge part of third bifacial photovoltaic transparent panel 600L is connected to top edge part of fourth bifacial photovoltaic transparent panel 600R and from there connected to the fourth bottom bifacial photovoltaic transparent panel 600L (alternatively un-tempered glass), forming the second Multiple at least two bifacial photovoltaic transparent panel Triangles Sub-assembly 103. From there everything repeats itself in the second upper (above) row where the cycle begins one step shifted aside forward, creating an array of triangular rooftop shaped two side panels structures situated respectively between relative horizon and the ground.

Multiple Bifacial Photovoltaic Transparent Panels Triangles Reflective Mirrors Ensemble 101 may be integrated with rear mirrors reflector 104 (e.g., as shown in FIG. 2), and at the bottom reflectors mirrors 108 situated below the Multiple Bifacial Photovoltaic Transparent Panels Triangles Sub-assembly 103. Alternatively, mirrors including a plurality of arched and/or parabola and/or paraboloid mirrors, may be used which may increase the reflective surface area and the efficiency of the bottom bifacial photovoltaic cells Transparent panels 500A and 500B (e.g., as shown in FIG. 6) associated with at least two bifacial photovoltaic transparent panels module 600L and 600R. The dotted rhombus shows the opening path for the sun's rays through the transitions opening path 1005 between Multiple Bifacial Photovoltaic Transparent Panels Triangles Sub-assembly 103 to the back of it, and vice versa through the reflective mirrors (see FIG. 10). Direct or crossing tilted angled mirrors reflectors 104 in the back side combined with another array of direct or crossing angled mirrors reflectors 108 may reflect the sunrays to multi bifacial photovoltaic transparent panels module 600L and 600R, to the eight sides upside down or, alternatively to at least two bifacial photovoltaic cells sheets/layers of transparent panels 500 which are relatively shifted one underneath the other of a bifacial photovoltaic cells transparent panels 500 and include the gap in between them 503A and 503B (e.g., as shown in FIG. 6).

Figure 8:
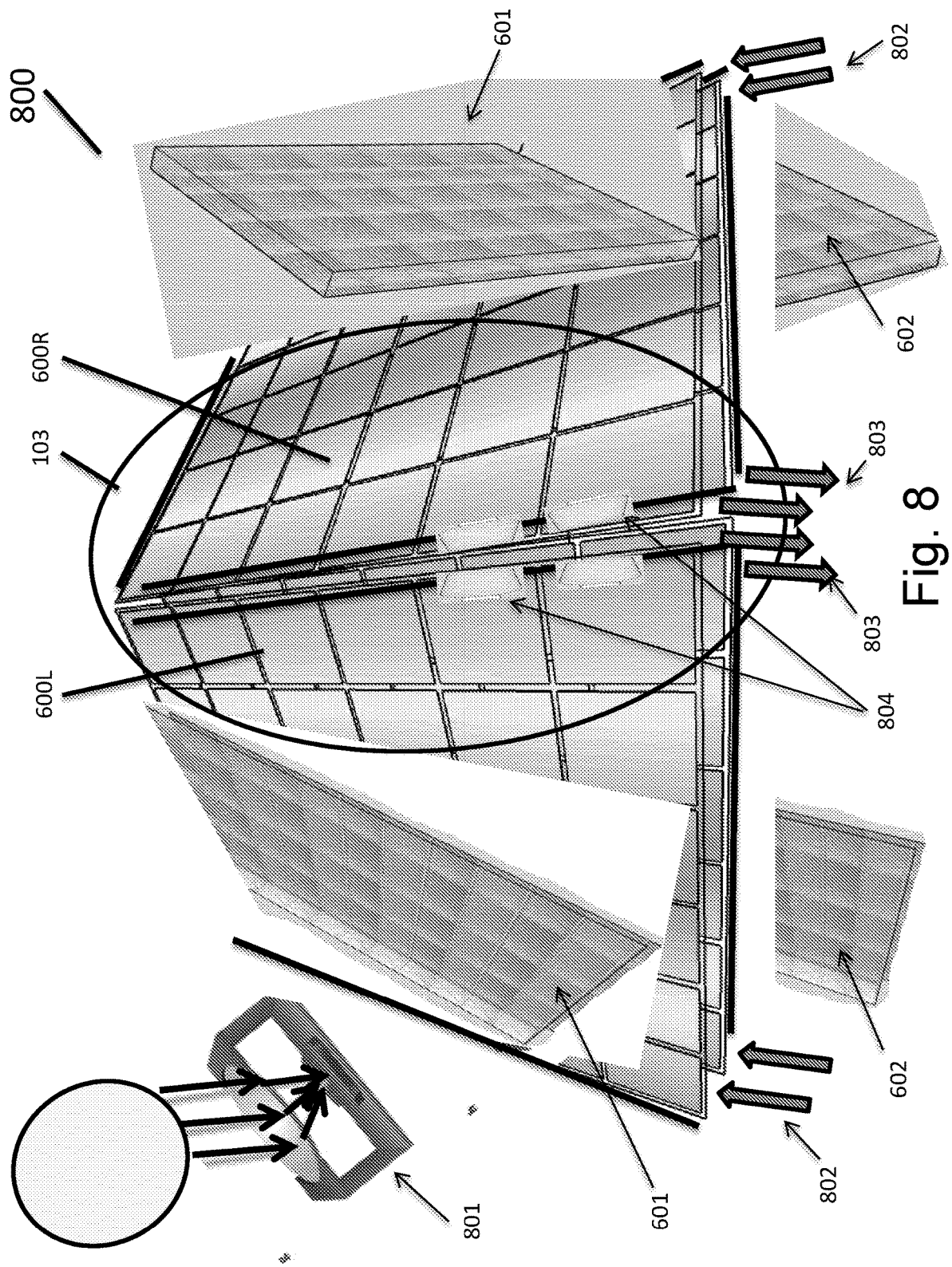
FIG. 8 schematically illustrates exemplary of at least two Multiple Bifacial Photovoltaic Transparent Panels Triangles Sub-assembly "8-faces sandwich" layers, comprising various tubes or/and flat water/liquid layers for cooling the panels, and for collecting heat and removing the heat using attached flat liquid tanks from the rhombus shaped openings box with concentrator and magnifier layers, according to an embodiment of the invention.

Reference is made to FIG. 8 which schematically illustrates a detailed view of Multiple Bifacial Photovoltaic Transparent Panels Triangles Sub-assembly 103 with at least "8 faces sandwich", according to an embodiment of the present invention. provide a function associated with smart of At least two bifacial photovoltaic transparent panels module 600 L and 600R including eight faces (sides) associated with at least four bifacial photovoltaic cells sheets/layers which are relatively shifted one underneath the another with the separation gap in between, respectively, increase the power output from at least two bifacial photovoltaic transparent modules 600 L and 600R. Two layers of sun's ray concentrators 601 on each side of the modules 600L and 600R reflect the sun's rays on the top. A second concentrator 602 in front of reflective mirrors reflect sun and albedo light and improve the sun's rays effect on the at least two bifacial photovoltaic transparent modules 600 L and 600R which are relatively oriented towards the angle of the sun. The combination provides "off center" shifted or direct centralizer magnifiers concentrators layers, which includes layers of sun's ray concentrator 801, on each side of the multiple transparent bifacial panels respectively. Integrated with the Sun Tracker, this greatly improves the power output of the modules. Also contributing to increase the power output may be the coating on the casing structure frame which may serve the same purpose or alternatively, the box structure or flexible casing of transparent sunrays magnifying concentrators envelop balloon.

The at least two bifacial photovoltaic transparent solar panels 600 L and 600R tend to heat in the sun and therefore included is a cooling water network system, according to an embodiment of the present invention. Chilled/heated water 802 is provided via water pipes/conduits associated with water transparent liquid flat tanks layers 804 incorporating the sides of the bifacial photovoltaic transparent solar modules 600 exposed to the sun spread the sun's rays and albedo light through the water circulation system. This spreads light to the at least two bifacial photovoltaic transparent solar panels 600 L and 600R such that make the water. The hot water pipes/conduits 803 are passing out through the outer water pipes channels network, incorporating with across and inside the photovoltaic distribution layers of Multiple Bifacial Photovoltaic Transparent Panels Triangles Reflective Mirrors Ensemble 101 (e.g., as shown in FIG. 1), and carried via outer hot water pipes/conduits to buildings, houses and other consumers.

Figure 9:
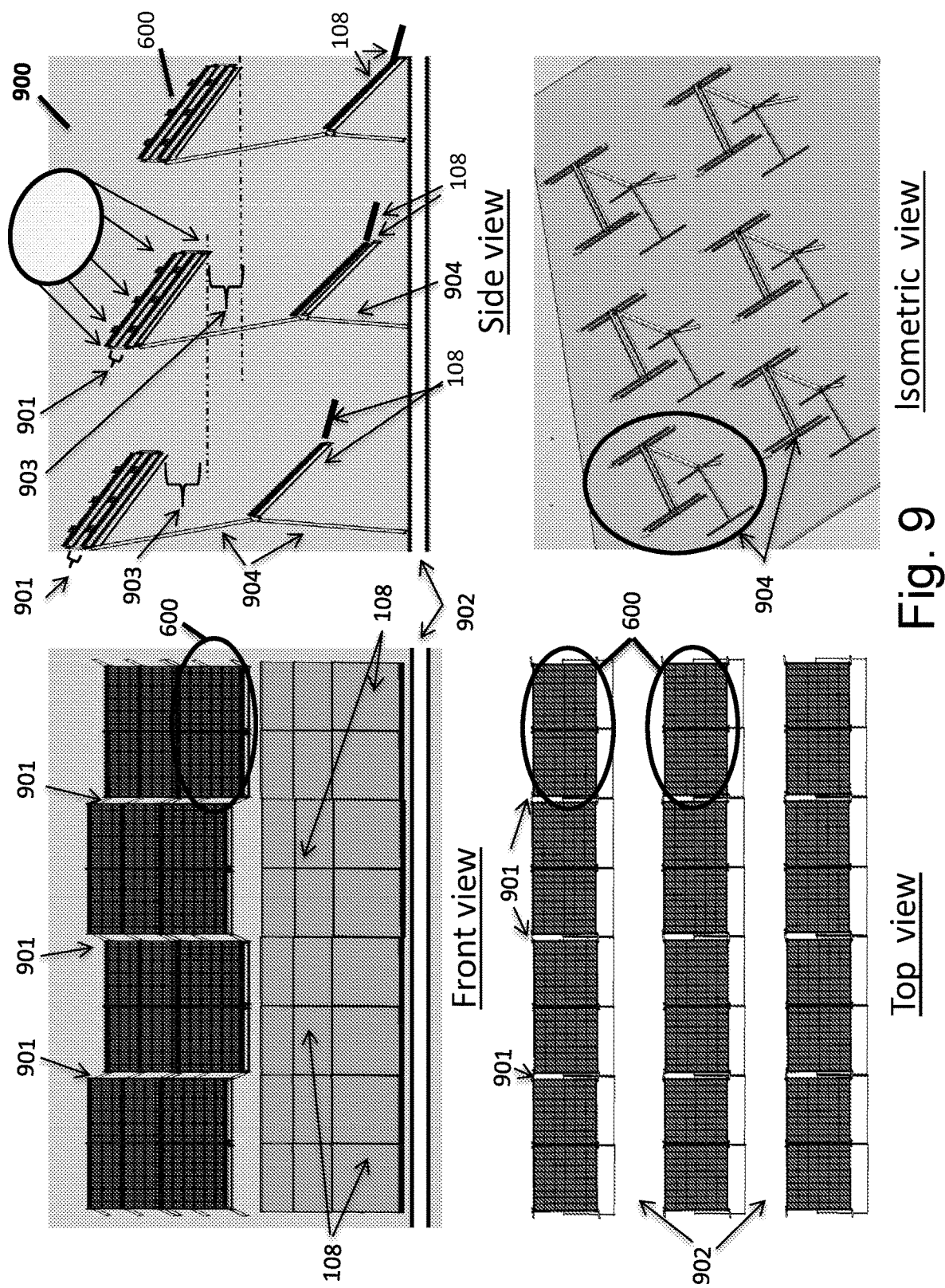
FIG. 9 schematically illustrates various views of exemplary implementation of an integrated array of ranked rows terraces comprising Bifacial Photo-Voltaic Transparent Panel Thermal structures of with various bottom reflective mirrors configured to increase the capacity of electrical and hot water production, associated with the sunrays, according to an embodiment of the invention.

Reference is made to FIG. 9 which schematically illustrates an exemplary implementation of various array of ranked rows terraces 900, comprising Bifacial Photo-Voltaic Transparent Panel Thermal 500 or Bifacial Photo Voltaic Transparent Panels Thermal Module 600 (see FIG. 5 and FIG. 6) integrated with bottoms mirrors 108, to allow sun energy penetration in the morning and late afternoon through the ranked rows sides 901 of Bifacial Photo-Voltaic Transparent Panel Thermal creating Multiple Bifacial Photovoltaic Transparent Panels Thermal configuration integrated in the structure, according to an embodiment of the present invention.

- Front view show details of the positions of array of terraces in different levels respectively to the bottom mirrors 108L, and relative to each other. The mirrors may be alternatively divided into different heights and spaces relative to the Multiple Bifacial Photovoltaic Transparent Panels 500 or 600. They may furthermore define a structure of a plurality of convex arched and parabola and paraboloid shapes 902 which may serve to increase the surface and the efficiency of the at least two bifacial photovoltaic transparent panel energy.
- Side view shows details on the array of ranked rows comprising different levels and spaces between rows 903 allow sun light passing to the bottom positions and include sidelong view of structural of triple supports 904, connected through the upper edge and through the middle panels shaped in H structure, parallel to supporting the H-shaped structure of bottom mirrors 108, respectively and relative to each other. Furthermore, the plurality of mirrors may be divided into sections at different heights and spaces relative to the Bifacial Photovoltaic Transparent Panels s Thermal Module 600 or Bifacial Photo-Voltaic Transparent Panel Thermal 500 Sub-assembly. The mirrors may include a convex arched and parabola and paraboloid shapes 902, which may serve to increase the surface and the efficiency of the at least one bifacial photovoltaic transparent panel thermal 500 sun energy.
- Top and isometric views, emphasizes the ranked row, correlated with two different dimension of minor gaps (spaces) 901, between the Bifacial Photovoltaic Transparent Panels Thermal Module 600 or Bifacial Photo-Voltaic Transparent Panel Thermal 500, create an opening transition for sun energy throughout the day, increasing the electrical production from the back side of the panels.
- Structure of triple supports 904 combined with rubber at the top along the edges of the structure H, for the support, reinforcement and thermal separation of the liquid tanks sheets/layers and liquids hollow rods/tubes.

Reference is made to FIG. 10 which schematically illustrates an exemplary implementation mechanism which includes—three rows triangular rooftop-shaped Multiple Bifacial Photovoltaic Transparent Panels Triangles Reflective Mirrors Ensemble 101 shifted aside with respect to one another, according to an embodiment of the present invention. Multiple Bifacial Photovoltaic Transparent Panels Triangles Reflective Mirrors Ensemble 101 are attached to second set bottoms outer edges sides of bifacial PV panels (e.g. triangular) rooftops shape Multiple Bifacial Photovoltaic Transparent Panels Triangles Reflective Mirrors Ensemble 101, forming a zigzag shape, and configured as upright tilted terraces to the sun in optimal electricity production in two or more rows of Multiple Bifacial Photovoltaic Transparent Panels Triangles Reflective Mirrors Ensemble 101. The rows are phase-differenced, shifted aside with respect to one another to form opening with a rhombus or trapeze shape, and are mounted on the diamond or rhombus shape frame box structure which is laminated inside with multiple reflecting mirrors films. The whole structure is integrated above the motorized two channel sun heliostat mechanism including the combination of at least four Multiple Bifacial Photovoltaic Transparent Panels Triangles Reflective Mirrors Ensemble 101 in two rows (two floors), e.g., as indicated by the area within the boundaries of the highlighted dotted line 1004. The first row 1001 with the bottom reflecting mirror 110 are reflecting to the above rows of the Multiple Bifacial Photovoltaic Transparent Panels Triangles Reflective Mirrors Ensemble 1001 and 1002 and 1003. In this FIG. 10 is shown the phase difference between the rows of Multiple Bifacial Photovoltaic Transparent Panels Triangles Reflective Mirrors Ensemble 1001 and 1002 and 1003. Dotted rhombus shows the opening path for the sun's rays through the transitions opening 1005 between Multiple Bifacial Photovoltaic Transparent Panels Triangles Sub-assembly 103 to the back of it, vice versa through the reflective mirrors. The transition openings schematically illustrated by the rhombus shape, or alternatively, by other shapes (e.g. trapeze, diamond), the passage of the sun's rays to the back and to the back side of second bottom (rear) bifacial photovoltaic transparent panel, in order to absorb sunlight optimally.

Figure 11:
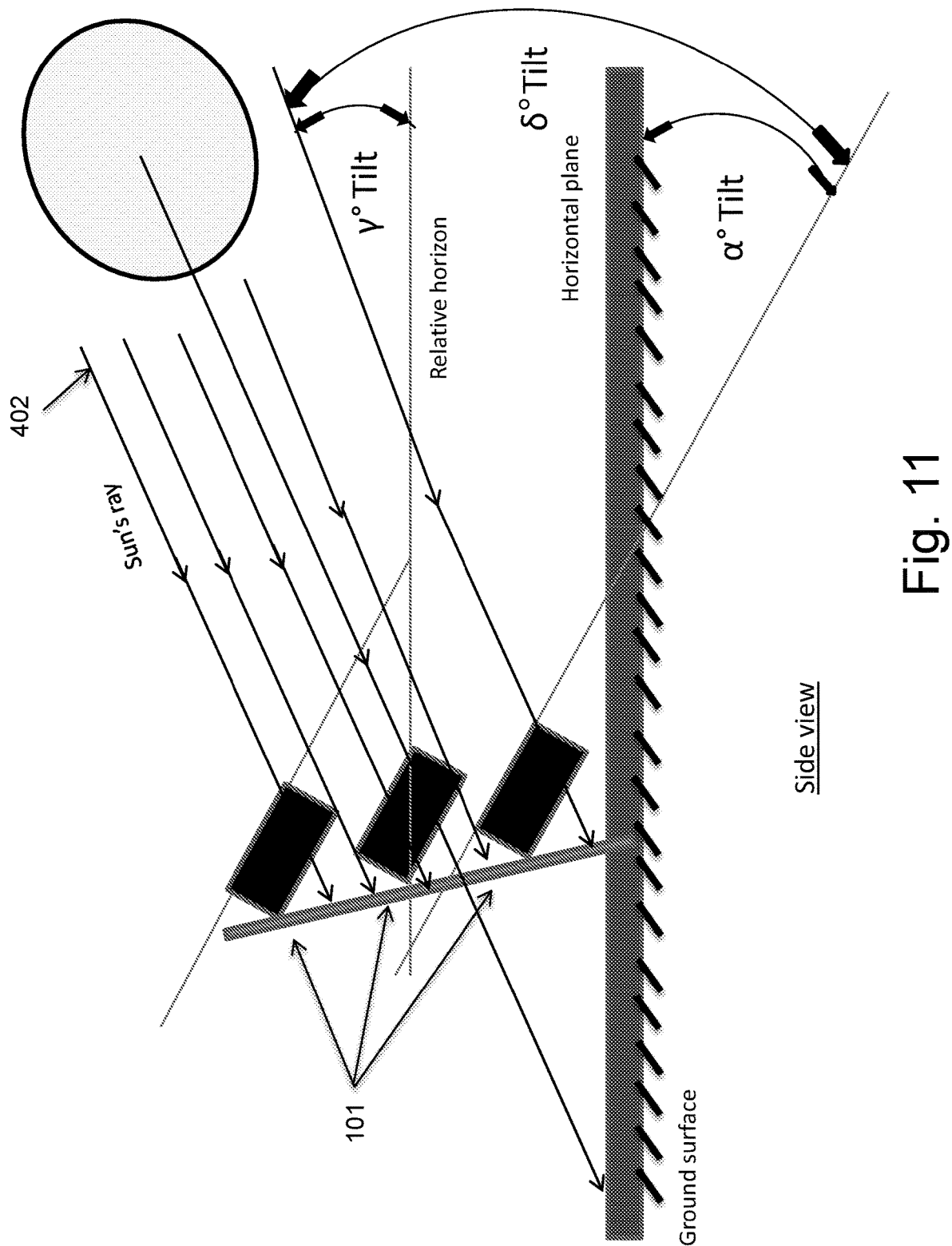
FIG. 11 schematically illustrates details of a tilted angles scheme, oriented relative to the sun, relative to the horizon, and to Multiple Bifacial Photovoltaic Transparent Panels Triangles Reflective Mirrors Ensemble, according to an embodiment of the invention.

Reference is now made to FIG. 11 which schematically illustrates a side view of Multiple Bifacial Photovoltaic Transparent Panels Triangles Reflective Mirrors Ensemble 101 (as shown in FIG. 1) with details of tilt angles scheme, according to an embodiment of the present invention. The scheme shows a first orientation of angle $\gamma°$ between the sunrays 402 and horizon relative to the angle $\alpha°$ of Multiple Bifacial Photovoltaic Transparent Panels Triangles Reflective Mirrors Ensemble 101 tilted rows, whereby consolidation of tilt angle $\alpha°$ with the angle $\gamma°$, i.e.; the ratio between the sun's rays angle and the top part of the Multiple Bifacial Photovoltaic Transparent Panels Triangles Reflective Mirrors Ensemble 101, form together the $\square°$ angle.

Figure 12:
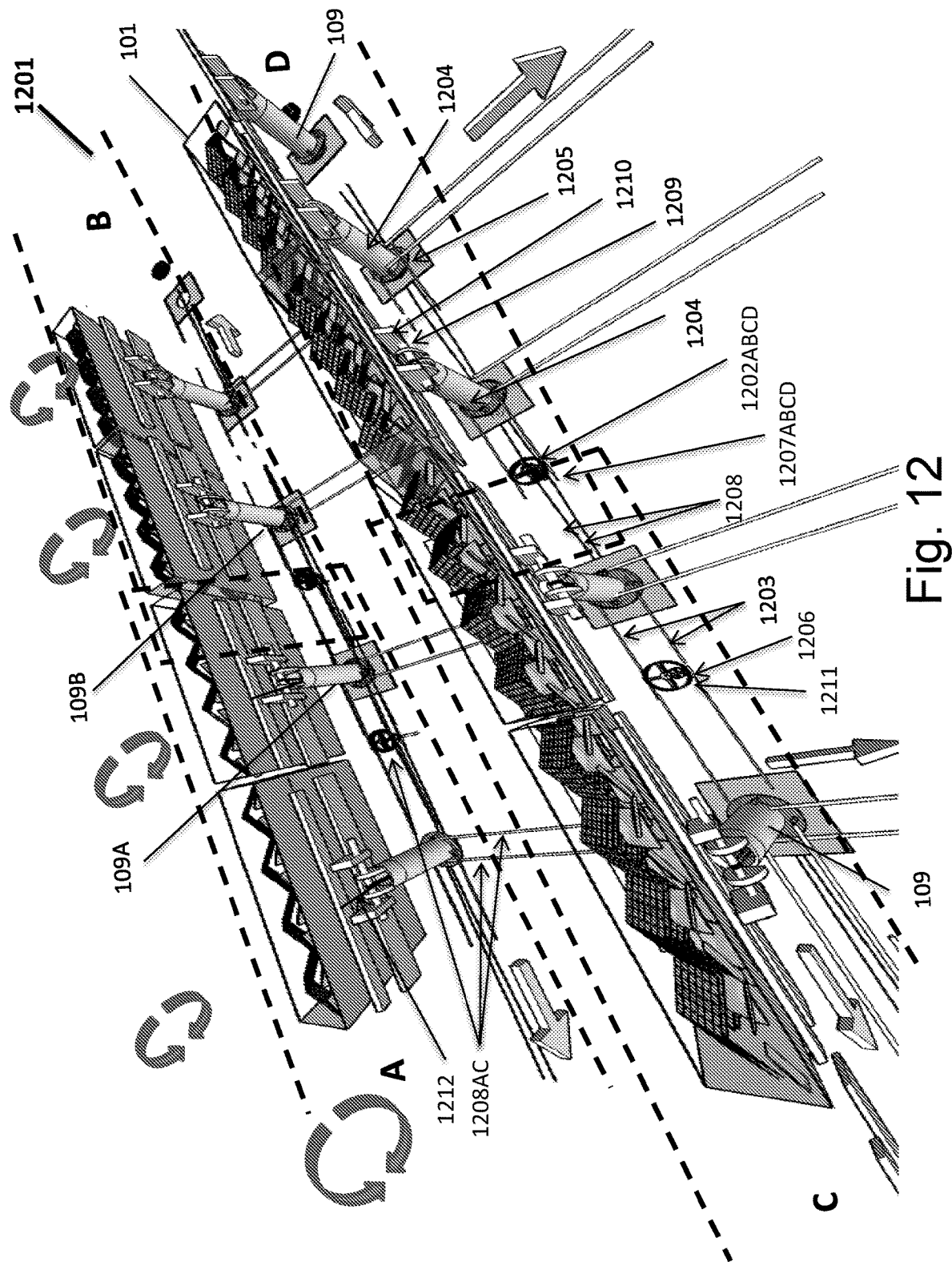
FIG. 12 schematically illustrates various arrays of multiple axes sun-tracking mechanisms, placed in various positions, relative to North-South-East-West, and connected to each other within various channels with cables or chain links by various of individuals overlapping clasp cables (wires) strips, which together are driven by common electric gears motors, according to an embodiment of the invention.

Reference is made to FIG. 12 which schematically illustrates various arrays of multiple axes, integrated hollow pylon sun-tracking mechanisms, according to an embodiment of the present invention. The hollow pylon sun-tracking mechanisms are placed in various positions 1201, and are connected to each other by a variety of individual overlapping clasp cables (wires) strips or chain link 1203 & 1208 (clasps the axes and wheels). The hollow pylon sun-tracking mechanisms together are connected to a common driver electric gear motors 1202ABCD & 1207ABCD. These are connected and associated with common drivers and a central common controller integrated with a plurality of various Multiple Bifacial Photovoltaic Transparent Panels Triangles Reflective Mirrors Ensemble 101. connected to thin (e.g. glass) or metal bars or cables frame casing structure 102 (see FIG. 1). The whole complex is mounted above various sun tracking mechanisms 109 (see FIG. 1) which include central hollow pylon 1204 connected above turret hub bearing double flanges (faces) 1205 which are capable of rotating both clockwise and counterclockwise. In this embodiment, the circular motion is bidirectional, and is associated with reversible junctions of a variety of placements of driver cables or chain links, respectively with driven cables or chain links 1203 & 1208, which transfer the force vectors to the axes 1204 & 1209/The cables or chain links 1203 & 1208 which are mounted side by side clasp the axes 1204 & 1209 and transfer the forces to the adjacent sun tracker mechanism located nearby to provide the different tilted angles. All movements are synchronized simultaneously. Every sector may include an array of a variety of multiple axials sun-tracking mechanisms 1201. For each group of sectors A, B, C, D and more, there is in common for each one of the groups electric gear motors 1202ABCD & 1207ABCD which are located at overlapping clasp points between the sun trackers 109, on the centrals hollow pylons (axis) 1204 and are used to drive different sectors in various positions simultaneously. The driving is through cables or chain links 1203 configured for transferring circular motion to cables or chain links and from there to another main central hollow pylons (axis) 1204 for the purpose of movements between East-West positions. Through the center of the hollow pylons (axis) 1204 pass through and rise up cables or chain links 1208 which are used for transmission of driver forces from the common electric gear motors 1207. A group of tilted "rolling cables or chain links drums" 1303 (as shown in FIG. 13) are configured to transfer and change direction of vector forces through cables 1208 in different directions, performing mechanical rotational movements through another top central axis 1209, alternatively, at the top of hollow pylon 1204. Cables or the chain links associated with top split up cables or chain links 1212 connect to the base tilting the Multiple Bifacial Photovoltaic Transparent Panels Triangles Reflective Mirrors Ensemble 101 structure up and down (as shown in FIG. 1) in the directions of North and South, for example. Between sectors A and B or C, when the distance between sun trackers are large, there are idle multiply wheels 1206 & 1211 configured to transfer cables or chain links force vectors, as well as for maintaining the tension in the cables 1203 & 1208 and between the mechanisms that follow from one sun tracker to the other and so on, associated with the plurality of heliostat mechanism facility, North-South-East-West respectively.

Reference is made to FIG. 13. which schematically illustrates several types of wheels associated with electric gears motors and connected to various cables or chain links in the multiple axials sun-tracking mechanisms 109 (see FIG. 1), according to an embodiment of the present invention.

Front view shows Multi sectors horizontal driver common electric gear motor wheels 1202AB (central hollow pylon 1204 s, shown in top view) drives several sectors, for example sector A & B (e.g., as shown in FIG. 12). Sector A is driven through upper layers cables 1203AM (above turret hub bearing) through cable tensioners 1301A & 1301B (embedded in all cables), wherein the upper cables layers clasp the bottom of the hollow pylons which are connected to idle wheels or drum 1206A (in longer distance between sun trackers 109) which split the vector forces to various sectors. The same is done in other sectors B, C, D and more, wherein the same procedure done in layers cables 1208AC, which is connected to idle wheels 1211A.

Side View shows common electric wheels gear motor 1207AB associated with several sectors, for example sector A and B. Driver cables 1208AM and 1208BM transfer vector forces in different directions horizontally and change the angle to vertical cables or chain links 1208AMV and 1208BMV through groups of tilted "rolling cables or chain links drums" 1303. Vertical cables or chain links 1208AMV and 1208BMV perform mechanical rotational movements through clasp surface 1302A and 1302B on top central axis 1209A and 1209B. Alternatively, cables or the chain links associated with top split up cables or the chain links 1212 connect to the base of Multiple Bifacial Photovoltaic Transparent Panels Triangles Reflective Mirrors Ensemble 101 structure (as shown in FIG. 12), (the same procedures carried out in all sectors combined sun trackers). This allows rotating, the plurality of Multiple Bifacial Photovoltaic Transparent Panels Triangles Reflective Mirrors Ensemble systems 101 assemblies, connected to metal bars frame case structure 102 (see FIG. 1) through various angles between North and South.

For example; when sector A requires driving "rolling cables chain links drums" 1303; driver cable layers 1208AD integrated with another sector group of North & South sun trackers 109 may used for required additional sectors or when long distances are required or during strong winds (tracking mechanisms 109 includes Multiple Bifacial Photovoltaic Transparent Panels Triangles Reflective Mirrors Ensemble systems 101 assemblies), respectively, increasing the quantities of overlapping clasp loops.

For example, in all sectors, cables 1203 connected to hollows pylons 1204 are mounted above turret hub bearing double flanges 1205 connected to general base structure 1304. Cables 1208 are arranged in a network configuration under turret hub bearing double flanges 1205 and general base structure 1304, rises up in hollows pylons 1204 toward the top axis (tilting the upper structure up and down) 1209 and down towards the back, to bottom rolling cables or chain links drums 1303. When the hollow pylons rotate around themselves, the vertical cables 1208 located in the center of the hollows pylons rotate vertically in a twisted shape of threaded screw, in both directions (e.g. at least 150° East and 150° West)

Top view shows a junction of sector A and sector B including support structure 1305 connected to mounting bearings brackets 1210, and a plurality Multiple Bifacial Photovoltaic Transparent Panels Triangles Reflective Mirrors Ensemble systems 101 assemblies, connected through a combination of metal bars or wires structure frame 102 (as shown in FIG. 1).

It is noted that although array of variety of multiple axes sun-tracking mechanisms 109, according to the present invention, are not limited to a specific number of Multiple Bifacial Photovoltaic Transparent Panels Triangles Reflective Mirrors Ensemble 101 and can comprise at least one or more multiple axials sun-tracking mechanisms 109, as explained hereinabove.

Figure 14:
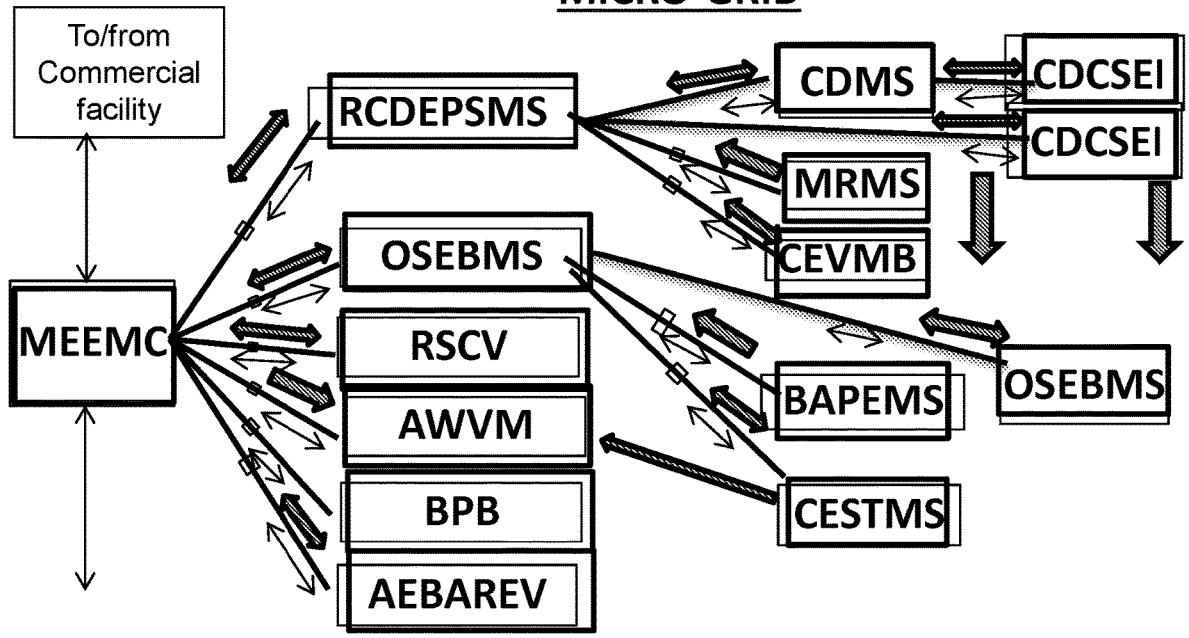
FIG. 14 is a flowchart showing the power management of a Micro Electric power Station Energy Management Center for supplying power to residential or commercial facilities, and for "electric fuel" stations, according to an embodiment of the invention.

Reference is now made to FIG. 14 which is a flowchart of a method of energy management of the MEPS 100, according to an embodiment of the present invention. The obtainment of electricity from MEPS 100, integrated with module batteries system, batteries of EVs, provision of electricity to EV batteries, buildings and houses are managed by a management software application capable of taking into account a plurality of parameters and accordingly determining an optimal state of power supply. For instance, in case a fully charged EV is parking during the night, the management software is able to determine the amount of charge the EV owner needs in the morning, and accordingly determine the amount of electricity that can be overnight discharged from the EV.

Other possibilities for energy flows are shown with respect to different facilities and services which can be employed by the MEPS 100. As suggested by the present invention. MEPS 100 may be implemented in various places and may provide interurban electric stations service. The following describes the acronyms of the possible services and management systems that can be provided using the MEPS 100 and which appear in these figures:

AMEEMC—Micro-Electric power station Energy Management Center;
H,M,LVDC—High, Medium, Low Voltage Direct Current
BAPEMS—Building, Apartments, at least two bifacial photovoltaic transparent panel Energy H,M,LVDC, Meter Management System;
RCDEPSMS—Robotic vertical, horizontal continually, Charge, Discharge Electric, multi (EV,EM,EB) Parking/cabins, boxes, Storages H,M,LVDC, facility Electric powered wheelchair Management System;
AEBMS—Apartment Electric Box, MVDC ~100-200V LVDC ~48V, Meter Management System;
MPVPMS—Multi CPVT (Concentrated Photovoltaic Thermal), CPV, PV Panels, HVDC, Meter, Management System;
CHWMS—Cooling & Hot Water Meter, Management System
BOSPEMS—Building, Offices, Shops, Commercial, at least two smart bifacial photovoltaic transparent panel Energy H,M,LVDC Management System;
CDMS—Charge, Discharge H,M,LVDC,Meter, Management System;
CESTMS—Cooling & Electric Steam, Turbine, (hot water for AWVM), Meter, Management System;
CDCSEI—Charge, Discharge; Cable H,M, LVDC Spots, Automatic Electromagnetic Induction H,M, LVDC Spots;
OSEBMS—Office, Shops, rooms Electric Box, Medium Voltage DC ~100-200V, Low voltage DC ~48V, Meter Management System;
AEBAREV—Accumulate Emergency Batteries HVDC, Recycled EVs, EMs, EBs & Meter;
BPB—Billing, Payment, Balancing station management system;
RSCV—Rents/taxis, Security, Camera, and Video;
AWVM—Automatic, hand, Washing Vehicle Machine;

Although embodiments of the invention have been described by way of illustration, it will be understood that the invention may be carried out with many variations, modifications, and adaptations, without exceeding the scope of the claims.

The invention claimed is:

1. A micro electric power station to generate electricity and produce hot water, comprising:
    a hybrid bifacial photovoltaic (PV) cells transparent double glass panel comprising Multiple Bifacial PV Transparent Panels Sub-assembly integrated with flat liquid transparent tanks;
  first hollow rods, profiles or pipes connected to an inlet and comprising inlet incline holes;
  second hollow rods, profiles or pipes connected to an outlet comprising outlet incline holes for circulating water or liquid being suitable to absorb heat through the flat transparent tanks;
    wherein each side of the bifacial PV transparent panel being connected to an adjacent flat transparent tank, each one of the flat transparent tanks being situated between a side of the bifacial photo voltaic transparent panel and an anti-reflection glass, the anti-reflection glass comprising supporting points, the flat transparent tanks being connected to the first and second hollow rods, profiles or pipes and the sum of the dimensions of the outlet incline holes, is larger than sum of the dimensions of the inlet inline holes.

2. The micro electric power station according to claim 1 wherein said Multiple Bifacial Photovoltaic Transparent Panels Sub-assembly comprises a triangular rooftop-like shape.

3. The micro electric power station according to claim 1 wherein each of said multiple bifacial photovoltaic transparent panels sub assembly comprises at least two Bifacial Photovoltaic Transparent Panels being placed in a parallel arrangement one on top of the other, are separated from each other by a separation gap and relative to one another in two different axes.

4. The micro electric power station according to claim 3 wherein said at least two Bifacial Photovoltaic Transparent Panels in said parallel arrangement are shifted relative to one another to allow light passing through a transparent gap between solar photovoltaic cells in one of the Bifacial Photovoltaic Transparent Panels to impinge on the solar photovoltaic cells in the parallelly arranged Bifacial Photovoltaic Transparent Panel, create sunray energy vibration movements between bifacial panels both back sides, wherein the same process happens between the back side of the BIFACIAL PV panel and the glass attached to the back side of the BIFACIAL PV panel.

5. The micro electric power station according to claim 1 wherein each one of said Bifacial Photovoltaic Transparent Panels comprises a plurality of substantially transparent thermal tanks layers for cooling and producing hot liquid flow system by absorbing heat from said photovoltaic cells through each one of said at least one Bifacial Photovoltaic Transparent double glass Panel.

6. The micro electric power station according to claim 5 wherein said plurality of thermal tanks layers comprises a transparent tops flat liquid tanks layer on a tops and/or bottoms sides of each one, when support/hold point between thermal layers of said at least one Bifacial Photovoltaic Transparent Panel system.

7. The micro electric power station according to claim 5 wherein said thermal tanks layers comprise substantially thin transparent sheets with two side incline edges cut at the ends, covering the bifacial solar photovoltaic cells transparent panel on both sides of each one of said at least single or more Bifacial Photovoltaic Transparent Panel, integrated second layer for thermal insulation by flexible transparent or glass/transparent material, alternatively reflecting mirrors.

8. The micro electric power station according to claim 1 wherein said hot water production system comprises a closed loop pumping mechanism to pump located on the top or exit water or liquid heated by at least one of said Bifacial Photovoltaic Transparent Panel systems.

9. The micro electric power station according to claim 1 further comprising a plurality array of ranked rows terraces of Bifacial Photovoltaic Transparent Panels integrated with plurality reflect mirrors, reflectors or albedo.

10. The micro electric power station according to claim 1 wherein the Multiple Bifacial Photovoltaic Transparent Panels are in a triangle configuration and coupled to reflective mirrors to define plurality of Triangles Reflective Mirrors Ensemble Systems, and wherein the micro electric power station further comprising a structure to support said plurality of Triangles Reflective Mirrors Ensemble systems said structure comprises central triple integrated reflective surface with/as supports of Bifacial Photovoltaic Transparent Panels shaped in H form.

11. The micro electric power station according to claim 1, comprising a plurality of outer envelope frame box and sunrays magnifying concentrators or other flexible covering balloon envelop structure.

12. The micro electric power station according to claim 1 further comprising a batteries array to store DC electricity generated by said plurality of Multiple Bifacial Photovoltaic Transparent Panel Triangles Reflective Mirrors Ensemble systems.

13. The micro electric power station according to claim 1, further comprising a management software system for managing multiple axial sun-tracking mechanisms, DC power charging, discharging, exchanging, accumulating, transferring, consuming, conducting, and consumption of electricity and hot water.

14. The micro electric power station according to claim 13 wherein said management software system includes use of a management software and interface applications tool to control the micro electric power station implementable in any one of a dedicated control panel, a mobile phone with a dedicated application software, and a computer system.

15. The micro electric power station according to claim 14 wherein said management software and interface applications tool includes managing electricity, hot water consumption, meters, billing, payment and balancing provision.

16. The micro electric power station according to claim 1 for use in a Micro-Grid Electric Pylons (MGEP) local electricity grid suitable for DC electricity power production and transmission, and for simultaneously supplying hot liquid, wherein said MGEP comprises pylons configured to support electricity transmission cables.

17. The micro-electric power station according to claim 1 further comprising a liquid circulation pumping mechanism system; a liquid heat exchange tanks or regular tanks; and backup tank to complete fluid evaporation;
  wherein the liquid circulation pumping mechanism system being connected to the outlet of the hybrid bifacial PV thermal panel to keep the flat transparent tanks in suction position, the liquid circulation pumping mechanism system further being connected to the backup tank, the backup tank being connected to the outlet and to the flat transparent tanks, the flat transparent tanks being connected to the backup tank and to the inlet of the hybrid bifacial photo-voltaic (PV) thermal panel.

18. A hybrid bifacial photovoltaic (PV) thermal panel comprising bifacial PV transparent panel, the bifacial transparent PV panel comprising bifacial PV cells in between two glass layers, between adjacent bifacial PV cells are transparent gaps; the hybrid bifacial PV thermal panel further comprising flat transparent tanks for water or liquid being suitable to absorb heat from the bifacial PV transparent panels, first hollow rods, profiles or pipes connected to an inlet and comprising inlet incline holes, and second hollow rods, profiles or pipes connected to an outlet comprising outlet incline holes for circulating water or liquid being suitable to absorb heat through the flat transparent tanks, wherein each side of the bifacial PV transparent panel being connected to an adjacent flat transparent tank, each one of the flat transparent tanks being situated between a side of the bifacial photo voltaic transparent panel and an anti-reflection glass, the anti-reflection glass comprising supporting points, the flat transparent tanks being connected to the first and second hollow rods, profiles or pipes and the sum of the dimensions of the outlet incline holes, is larger than sum of the dimensions of the inlet inline holes.

\* \* \* \* \*